US006894392B1

(12) United States Patent
Gudesen et al.

(10) Patent No.: US 6,894,392 B1
(45) Date of Patent: May 17, 2005

(54) SCALEABLE INTEGRATED DATA PROCESSING DEVICE

(75) Inventors: Hans Gude Gudesen, Brussels (BE); Per-Erik Nordal, Asker (NO); Geirr I. Leistad, Sandvika (NO)

(73) Assignee: Thin Film Electronics ASA, Oslo (NO)

( * ) Notice: Subject to any disclaimer, the term of this patent is extended or adjusted under 35 U.S.C. 154(b) by 0 days.

(21) Appl. No.: 09/463,900

(22) PCT Filed: Jun. 2, 1999

(86) PCT No.: PCT/NO99/00180

§ 371 (c)(1),
(2), (4) Date: Apr. 3, 2000

(87) PCT Pub. No.: WO99/66551

PCT Pub. Date: Dec. 23, 1999

(30) Foreign Application Priority Data

Jun. 2, 1998 (NO) ............................................. 982518

(51) Int. Cl.⁷ ............................................. H01L 23/48
(52) U.S. Cl. ........................ 257/759; 257/774; 257/777; 257/E21.705; 257/E23.063; 257/E25.013
(58) Field of Search ................................. 257/777, 369, 257/373, 310, 544, 728

(56) References Cited

U.S. PATENT DOCUMENTS

| 5,306,935 A | 4/1994 | Esquivel et al. |
| 5,383,269 A | 1/1995 | Rathmell et al. |
| 5,612,228 A | 3/1997 | Shieh et al. |
| 5,702,963 A | 12/1997 | Vu et al. |
| 5,714,768 A | 2/1998 | Ovshinsky et al. |
| 5,793,115 A * | 8/1998 | Zavracky et al. ........... 257/777 |
| 5,817,986 A | 10/1998 | Davidson et al. |

FOREIGN PATENT DOCUMENTS

WO 9509438 4/1995

OTHER PUBLICATIONS

A. Dodabalapur et al, Applied Physics Letter, vol. 68, No. 16, Apr. 1996.

* cited by examiner

*Primary Examiner*—David Nelms
*Assistant Examiner*—Mai-Huong Tran
(74) *Attorney, Agent, or Firm*—Birch, Stewart, Kolasch & Birch, LLP

(57) ABSTRACT

A scaleable integrated data processing device, particularly a microcomputer, comprises a processing unit with one or more processors and a storage unit with one or more memories. The data processing device is provided on a carrier substrate (S) and comprises mutually adjacent substantially parallel layers (P, M, MP) stacked up on each other, the processing unit and the storage unit being provided in one or more such layers and the separate layers formed with a selected number of processors and memories in selected combinations. In each layer are provided horizontal electrical conducting structures which constitute electrical internal connections in the layer and besides each layer comprises further electrical conducting structures which provide electrical connections to other layers and to the exterior of the data processing device. The integrated data processing device has a scaleable architecture, such that it in principle can be configured with an almost unlimited processor and memory capacity. Particularly can the data processing device implement various forms of scaleable parallel architectures integrated with optimal interconnectivity in three dimensions.

31 Claims, 20 Drawing Sheets

Figure 1:
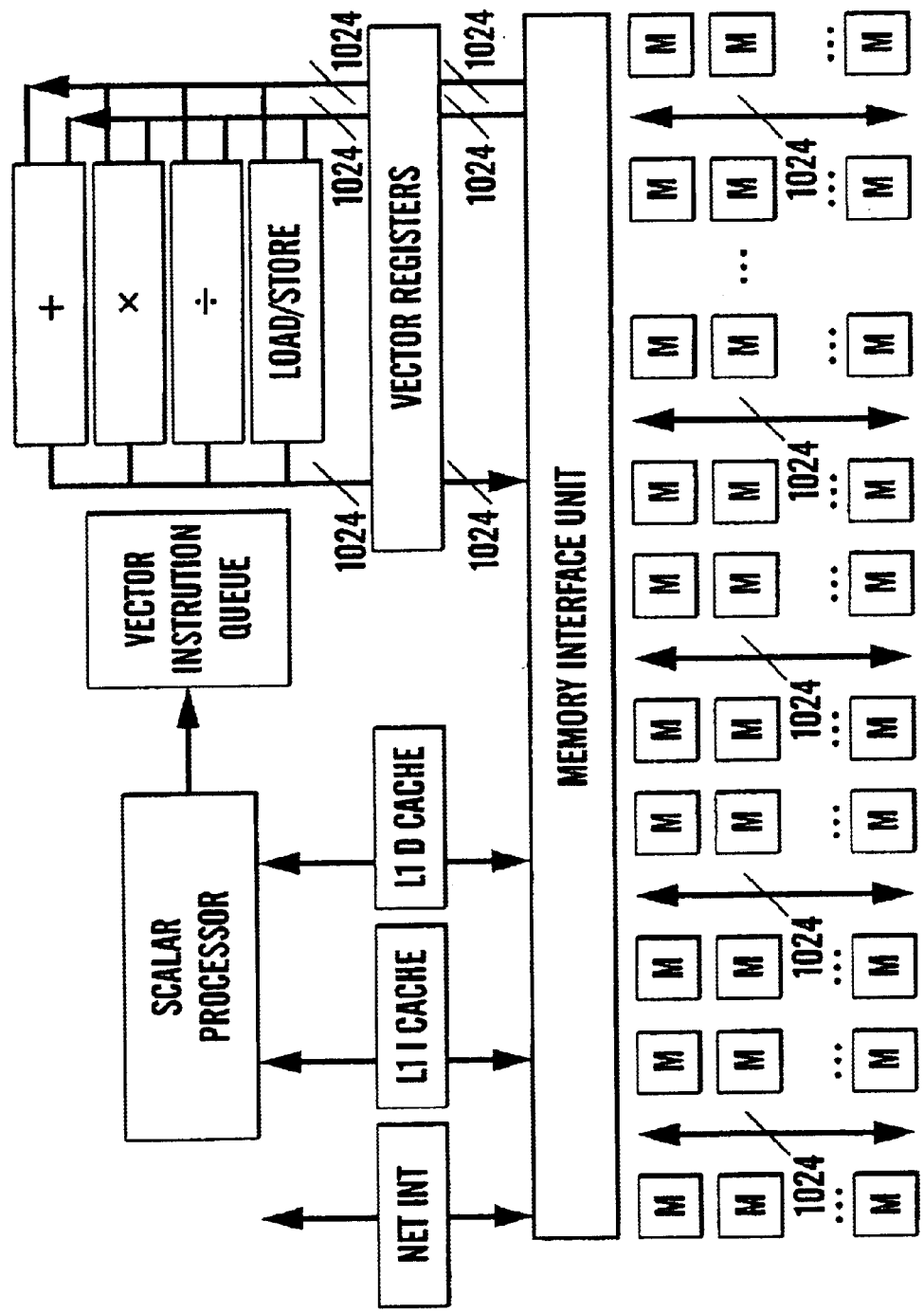

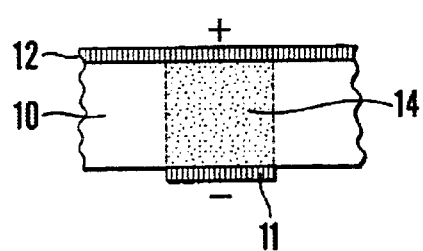
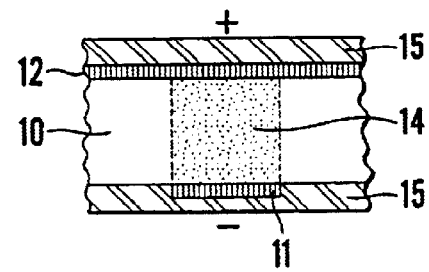
Fig.7c　　　　　　　Fig.7d
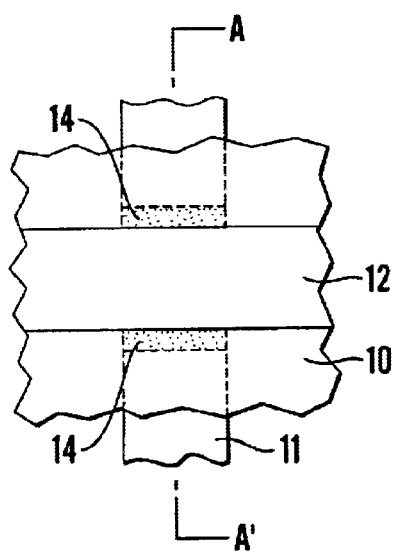
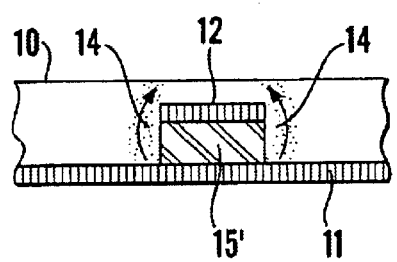
Fig.7e　　　　　　　Fig.7f

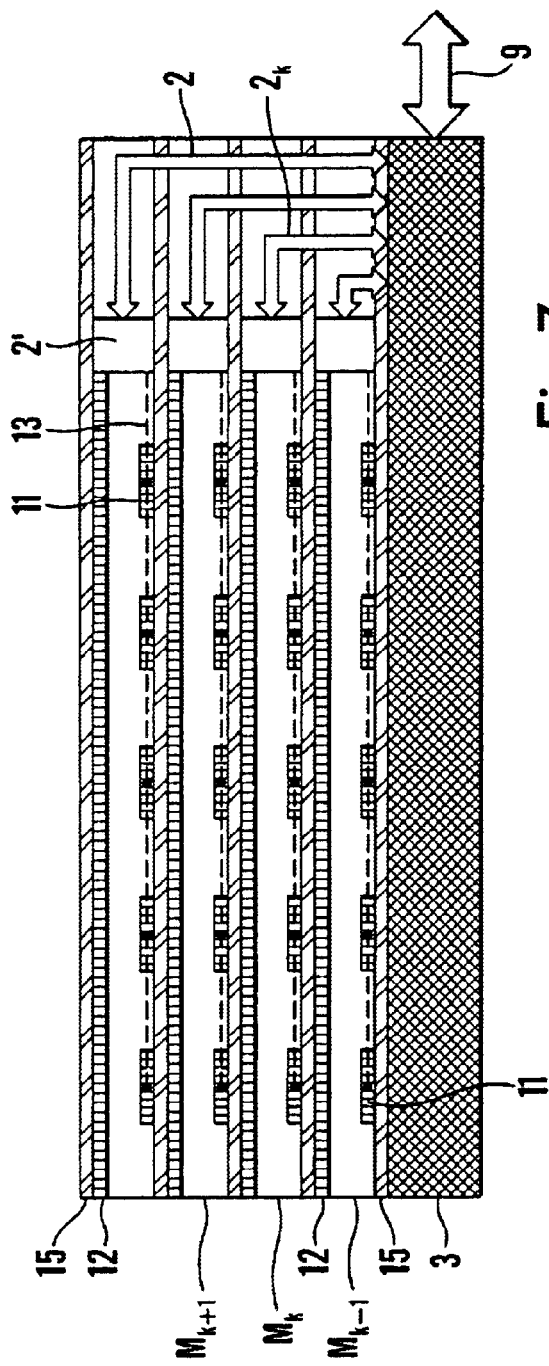
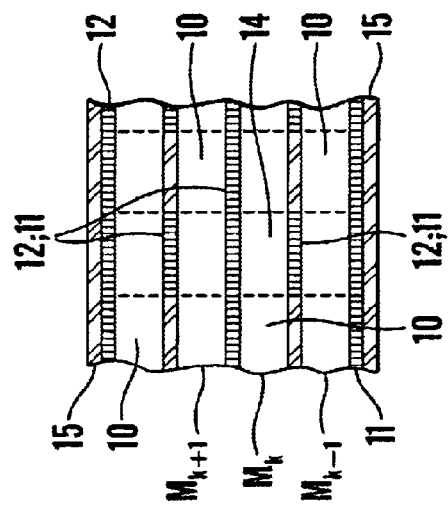
Fig. 7g
Fig. 7h

LEGEND TO FIGS. 15-21

| | |
|---|---|
| ☐ | ISOLATING |
| ▒ | SEMICONDUCTING |
| ⊟ | p-TYPE SEMICONDUCTING |
| ⊞ | n-TYPE SEMICONDUCTING |
| ▓ | CONDUCTING, ELECTRODES |
| ┳ | HORIZONTAL AND VERTICAL CONDUCTING PATH (△, UP; ▽, DOWN) |

SCALEABLE INTEGRATED DATA PROCESSING DEVICE

This application is the national phase under 35 U.S.C. § 371 of PCT International Application No. PCT/NO99/00180 which has an International filing date of Jun. 2, 1999, which designated the United States of America.

The invention concerns a scaleable integrated data processing device, particularly a microcomputer, comprising a processing unit, wherein the processing unit comprises one or more processors, and a storage unit, wherein the storage unit comprises one or more memories, and wherein the data processing device is provided on a carrier substrate.

An apparent paradox of today's semiconductor based data processing devices is that although the performance of the microprocessors as an average has increased by 60% per year in recent times and hence increased about 100 fold from the end of the eighties and up to 1998, the access time of random accessible write/read memories, so-called RAMs has diminished at about 7% per year and hence only been halved in the same time period. The gap between processor performance and the access bandwidth of RAMs has hence increased by a factor of about 50 during the last ten years. The development in regard of processor performance and access time hence makes it necessary to improve both the memory bandwidth and reduce the latency, that is the waiting time which occurs when instructions and data a re fetched. The emphasis in the development of dynamic RAMs (DRAMs) has, however, been on reducing the size of the memory cells in order to realise DRAMs with high storage density.

Generally, however, the cause of the above misproportion is quite evident. The processor must communicate with one or more memory types during the different phases of a computing task and in some cases the communication will be very intensive, for instance when the processing presupposes the use of look-up tables. In order to achieve high processing speeds, the fastest and most commonly used memories are provided physically integrated with the central processing unit. Unfortunately, such memories consume a relatively large chip area if their storage capacity is to be sufficient and it is necessary to compromise in order to distribute the available physical area between processor and high-speed memories. This in turn implies that further memory capacity only can be obtained via bus lines to more distant memory units. Depending on an optimisation in each separate case, the result will generally be that a total device architecture is obtained where much of the chip area and the processing performance of the central processing unit are used for handling the data flow between the central processing unit and more distant memory units which are connected with the central processing unit via bus lines on the semiconductor substrate.

In concrete terms this means that the microprocessor uses 75% of its time in the memory device when it executes database processing and matrix computations. The development has been such that 60% of the area and 90% of the transistors of the most modern microprocessors are adapted to handle the gap between the processor performance and access bandwidth by being used in special hardware on the chip, for instance in special high-speed memories or cache memories in order to handle the increasing latency. Also in regard of dynamic RAM (DRAM), the development caused unexpected difficulties. In 1986 it was employed a typical minimum memory capacity for PCs of 32 1 Mbit DRAM, while it in 1997 was used two 64 Mbit DRAMs because the growth rate of the minimum memory size only was half of the growth rate of the capacity of the DRAM. As most of today's microprocessors are oriented towards the use of cache memories, it is necessary with lower latency, but the development has instead progressed towards the higher bandwidths and high latency. It is evident that simply increasing the capacity of the DRAMs will not be satisfactory, as DRAMs with a capacity of 256 Mbit or 1 Gbit in reality results in higher costs per bit and cause a higher bandwidth requirement for error control. If the latter is to be met, the latencity, however, will be correspondingly higher.

In order to solve the problems which the disproportion between the processor performance and a RAM access time causes, it has recently been proposed (Patterson & Al., "Intelligent RAM (IRAM): Chips that Remember and Compute", 1997 IEEE International Solid-State Circuits Conference, pp. 224–225) to implement processing logic and memory on one and the same chip, where most of the transistors will be used in the memory device. An integrated data processing device of this kind has been denoted intelligent RAM or IRAM. The use of a DRAM with 1 Gbit capacity provides enough transistors to implement a powerful processor and a memory which is large enough to contain whole programs and data sets. In an IRAM of this kind, the memory is divided into blocks with memory gates with a width of for instance 1 Kbit. Typical chip sizes will be 600 mm$^2$, such that an IRAM requires more metal layers in order to increase the transmission speed of the lines and possibly also require faster transistors for the high-speed interface of synchronous DRAMs. The possible advantages suggested in case of IRAM include lower memory latency, e.g reduced by a factor of $10^{-1}$, high memory bandwidth, for instance any increase with a factor of 100, and lower power consumption. The dimensions of the memory (width dimension) can be adjusted, and an IRAM should not occupy an area on the board as large as conventional data processing devices with corresponding capacity in regard to storage and processing would do.

Alternatively it has been suggested (Yoo & al., "A 32-bank 1 Gb DRAM with GB/s Bandwidth, ISSCC Digest of Technical Papers, pp. 378–379, February 1996) to employ IRAM with vector processors. Such vector processors work with linear number arrays. Vector processors do not need cache memories, but require memory with low latency, often realized as static RAM (SRAM) with large bandwidth, as hundreds of separate memory groups may be used. The proposed IRAM system with a memory capacity of 1 Gbit will hence be adapted to the needs of a vector processor. This prior art is shown in FIG. 1 which schematically suggests how an IRAM vector microprocessor may be realized. Based on a 0.18$\mu$ DRAM process with a chip area of 6 cm$^2$ an IRAM could have 16 addition and multiplication units with a frequency of 500 MHz collectively to provide 100 Gbyte/s memory bandwidth. An IRAM of this kind could execute a typical test program (Linpack) with a speed of 8 GFLOPS, which is five times faster than Cray's vector-based supercomputer processor (Cray T-90). Whether IRAMs may have a breakthrough will be dependent on the memory capacity on a chip, as this is expected to increase from 10–32 Mb for graphic products such as games and to 128–256 Mb for network computers and portable PCs.

Further, the use of parallel processing in order to increase the processing speed is also known in the art. This has been achieved by basing the processors on architectures which allows processing of data and data sets in parallel. Typical examples are parallel processors on instruction level such as pipeline processors or superscaler which have an architecture that can handle very long instruction words (VLIW). Also, processors have been developed, which work on instruction level, but with data in parallel, and this may be realized either with pipeline architectures, systolic architectures, and, as mentioned above, with vector architectures. A difficult realizable desired goal has been the development of data processing devices which can work with architectures which allows parallel data processing on process level, that is so-called MIMD architectures (Multiple Instructions, Multiple Data). MIMD architectures with either distributed memories or common memories have been proposed, but in practice most of these architectures are initially based on different forms of multiprocessing in parallel, that is with use of processor networks. This is currently difficult to realize with an optimal interconnectivity and in any case impossible to implement in a chip configuration with current semiconductor technology, particularly as long as the chip size is limited to a few $cm^2$.

The increasing gap between the theoretical processing speed of modern central processing units and the total speed of the device is an important problem which has provided to be very difficult to overcome and almost impossible to solve by a further development of data processing devices based on for instance silicon-based semiconductor technology only. Neither an increase in chip size or structural solutions which employ vertical structures and hence achieve more components on one and the same substrate material have turned out to be suitable. This is closely connected with the memory devices comprising memory cells which explicitly are dependent on switches implemented in the semiconductor material of the substrate. In other words, each bit spot in a memory must have exclusive access to a part of the substrate, and hence structural solutions are required wherein memory devices and processor must be provided in juxtaposition. Attempts to form vertical structures, for instance by stacking several layers on each other, have also failed because it is still necessary to provide electrical access and components, for instance switches, in the same underlying semiconductor substrate. Hence, no net capacity increase is obtained by use of multilayer solutions and with the substrate area already exploited with maximum density. By using vertical stacked circuit layers heat dissipation of the separate layers also becomes a problem, as today's semiconductor-based memories are volatile and hence need refresh current, which generates heat.

Generally the stacking of several layers with components which use active switches based on today's semiconductor technologies implies the use of transverse current paths to underlying layers. This restricts to high degree the number of layers which may be stacked, particularly where the different layers and parts of these need dedicated current paths. In addition to the volume which is taken up by a dense network of transverse current paths, the complexity of the fabrication and hence the production costs increase quickly with the number of layers in the stack.

The possibilities of increasing the processing and memory capacity in an integrated data processing device and achieving sufficient memory bandwidth while the latency is reduced in correspondence with the increased processor speed seem to be small with today's semiconductor technologies. An increase in memory capacity is a goal for all memory types in today's data processing devices, but has turned out to be particularly difficult to realize for memories with fast random access without a tradeoff in processing performance with the size and cost of the devices. The necessary electrical connections are a problem in themselves and do not seem to be realizable, neither with the use of vertical or stacked configurations and not at all with an increase in the chip area in common one-layer technologies.

The main object of the present invention is hence to provide a integrated data processing device where a processing unit and memory unit are realizable with almost unlimited capacities in varying configurations and architectures, while bandwidth requirements and latency are optimized and without the electrical connection between the separate components placing a restriction on capacity and transfer times.

Another object is to avoid the use of conventional dynamic DRAMs, but instead realizing the memory unit in a technology which both allow fast access and large capacity with possibilities for a functional configuration of the memory unit in sub-units which separately for instance provide RAM functions, ROM functions or mass storage functions.

A third object is specifically to reduce every form of latency, such that processor performance and memory access can be adapted optimally and preferably such that cache memories in the processing unit are avoided.

A fourth object is to able to implement optimally scalable architectures for parallel processing integrated on one and the same substrate, whether it concerns the use of parallel processor architecture or a multiprocessor architecture with dynamic connection between processors working in parallel.

A fifth object of the invention is to realize the integrated data processing device in a volumetric configuration and with current paths which extend both horizontally and vertically in the volumetric configuration to provide an optimal interconnectivity between the separate components of the data processing device and simultaneously to reduce the data transfer rate between the components.

The above-mentioned and other objects are achieved according to the invention with a data processing device which is characterized in that the data-processing device comprises mutually adjacent, substantially parallel stacked layers, that the processing unit and the storage unit are provided in one or more layers, the separate layers being provided with a selected number of processors and memories in selected combinations, that each layer comprises in or on the layer horizontal electrical conducting structures which forms electrical internal connections in the layer, and that each layer comprises further electrical structures which provide electrical connection to other layers and to the exterior of the data processing device.

In an advantageous embodiment according to the invention one or more layers are realized in the form of a number of sublayers in a technology which on a first level of a functional hierarchy configures functionally one or more layers as a combined processor and memory layer, or one or more layers substantially as processor layers, or one or more layers substantially as memory layers.

In that connection it is also advantageous that the processing unit in a layer is configured functionally on a second level of the functional hierarchy as one or more processors or parts of one or more processors, at least one processor constituting a central processing unit or microprocessor in the data processing device, and possible further processors optionally being configured as control and/or communication processors respectively.

In an advantageous embodiment according to the invention the storage unit in a layer is configured functionally on a second level of the functional hierarchy as one or more memories or parts of one or more memories, at least one memory constituting a RAM and being connected with at least one central processing unit or microprocessor in the data processing device, and possible further memories optionally being configured as high-speed memories, ROMs. WORM,ERASABLE and REWRITEABLE respectively.

In that connection it is also advantageous that at least a part of the storage unit constitutes a mass memory, the mass memory optionally being configured as RAM, ROM, WORM, ERASABLE or REWRITEABLE or combinations thereof.

In a further advantageous embodiment according to the invention the further electrical structures in a layer are provided on at least a side edge of the layer as an electrical edge connection.

In a yet further advantageous embodiment according to the invention the further electrical conducting structures in a layer are provided as vertical conducting structures which form an electrical connection in the cross-direction of the layer and perpendicularly to its plane to contact electrical conducting structures in other layers.

Finally, it is according to the invention advantageous that one or more layers are formed of an organic thin-film material, the organic thin film material or materials being selected among monomers, oligomers and polymeric organic materials and metal-organic complexes, or combinations of materials of this kind, or that one or more layers are formed of inorganic thin-film material, the inorganic thin-film material or materials being selected among crystalline, polycrystalline and amorphous thin-film materials, or combinations of materials of this kind.

Particularly according to the invention all layers are formed of an organic thin-film material.

Advantageously, according to the invention are two or more layers formed of both organic and inorganic thin-film materials or combinations of materials of this kind.

Figure 2:
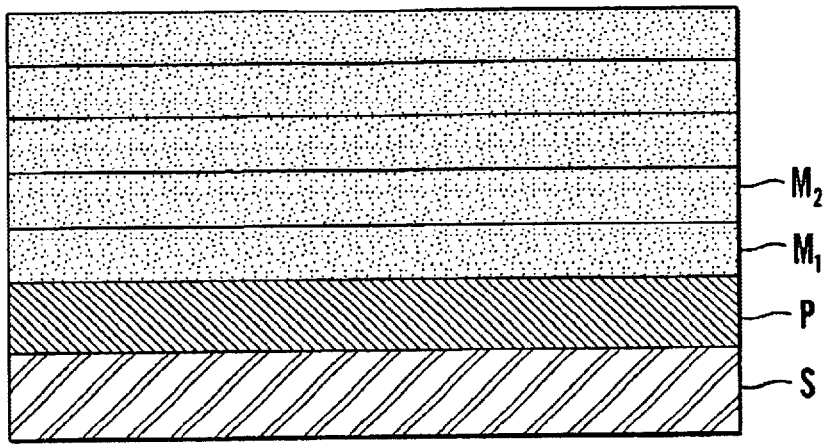
Figure 3:
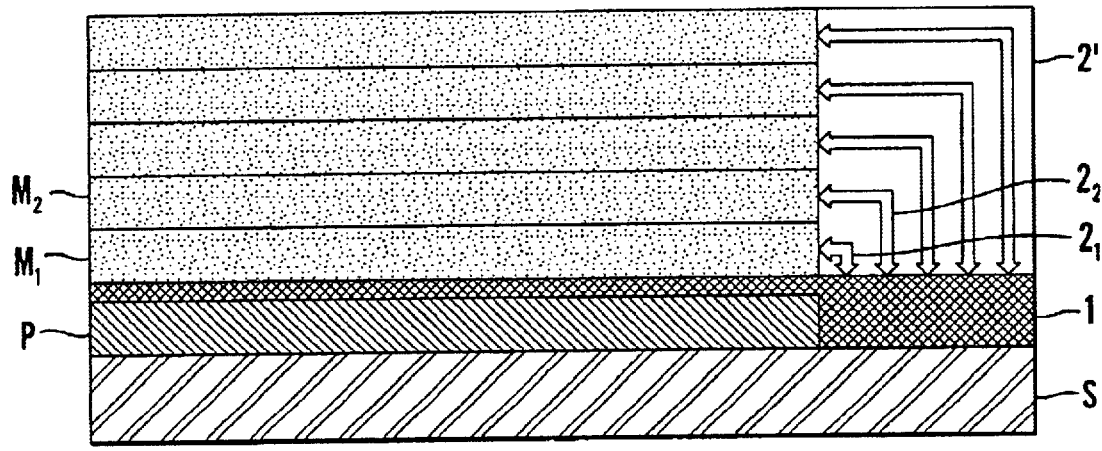
Figure 4:
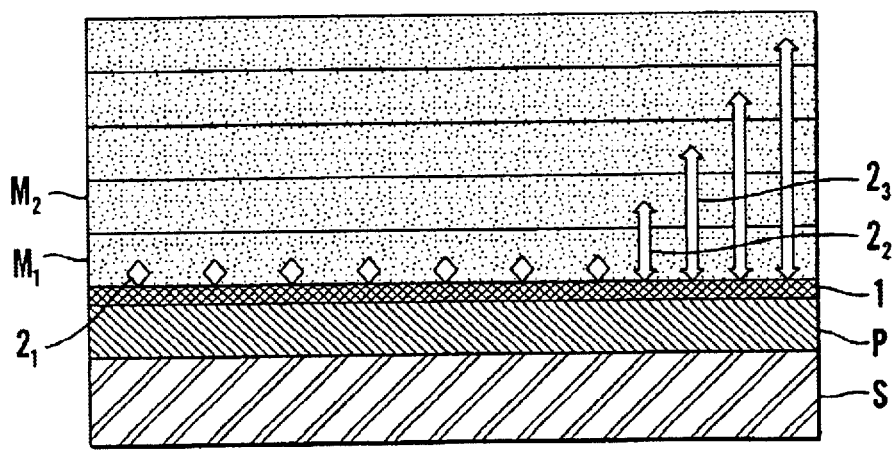
Figure 5:
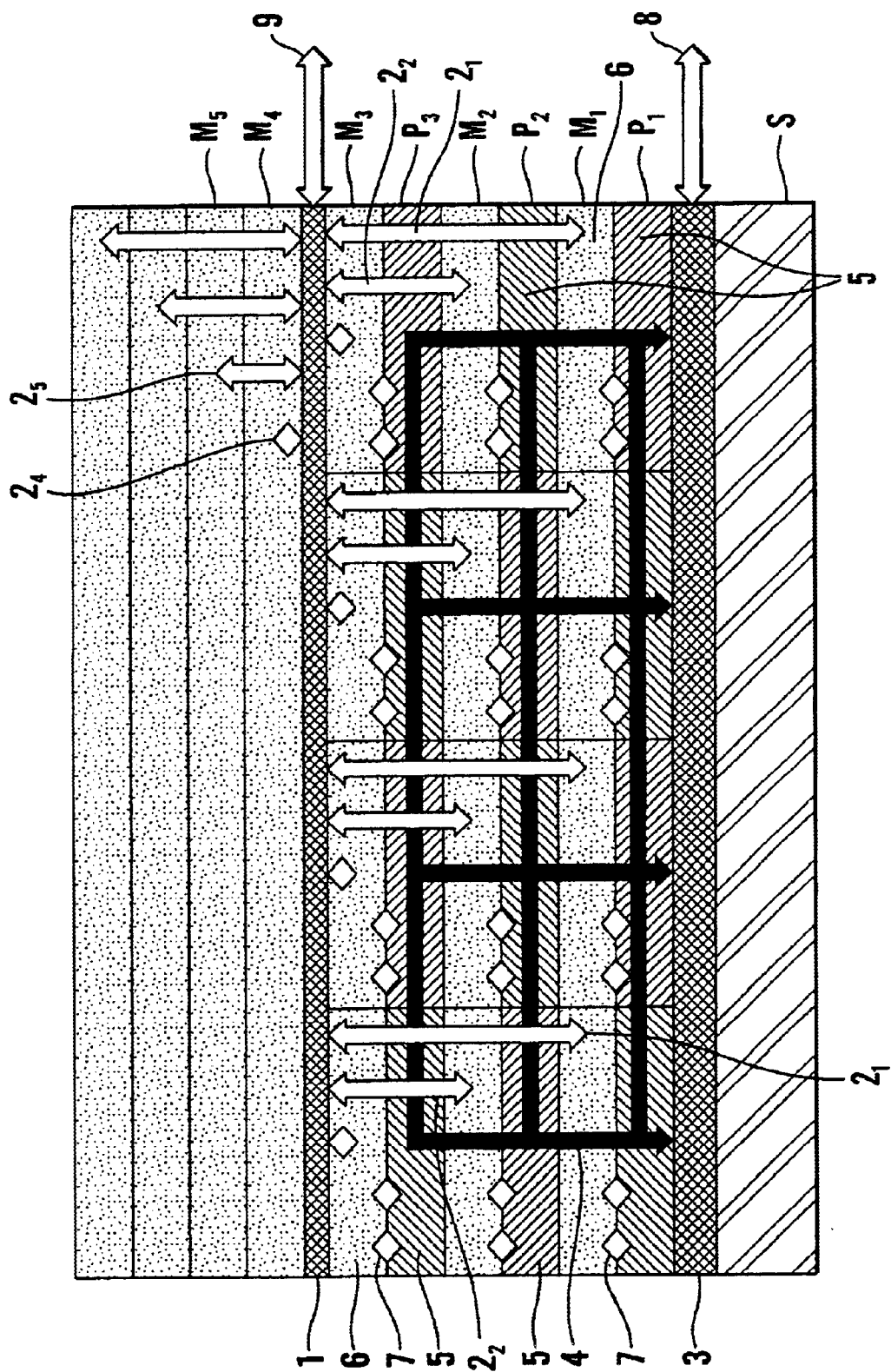
Figure 6:
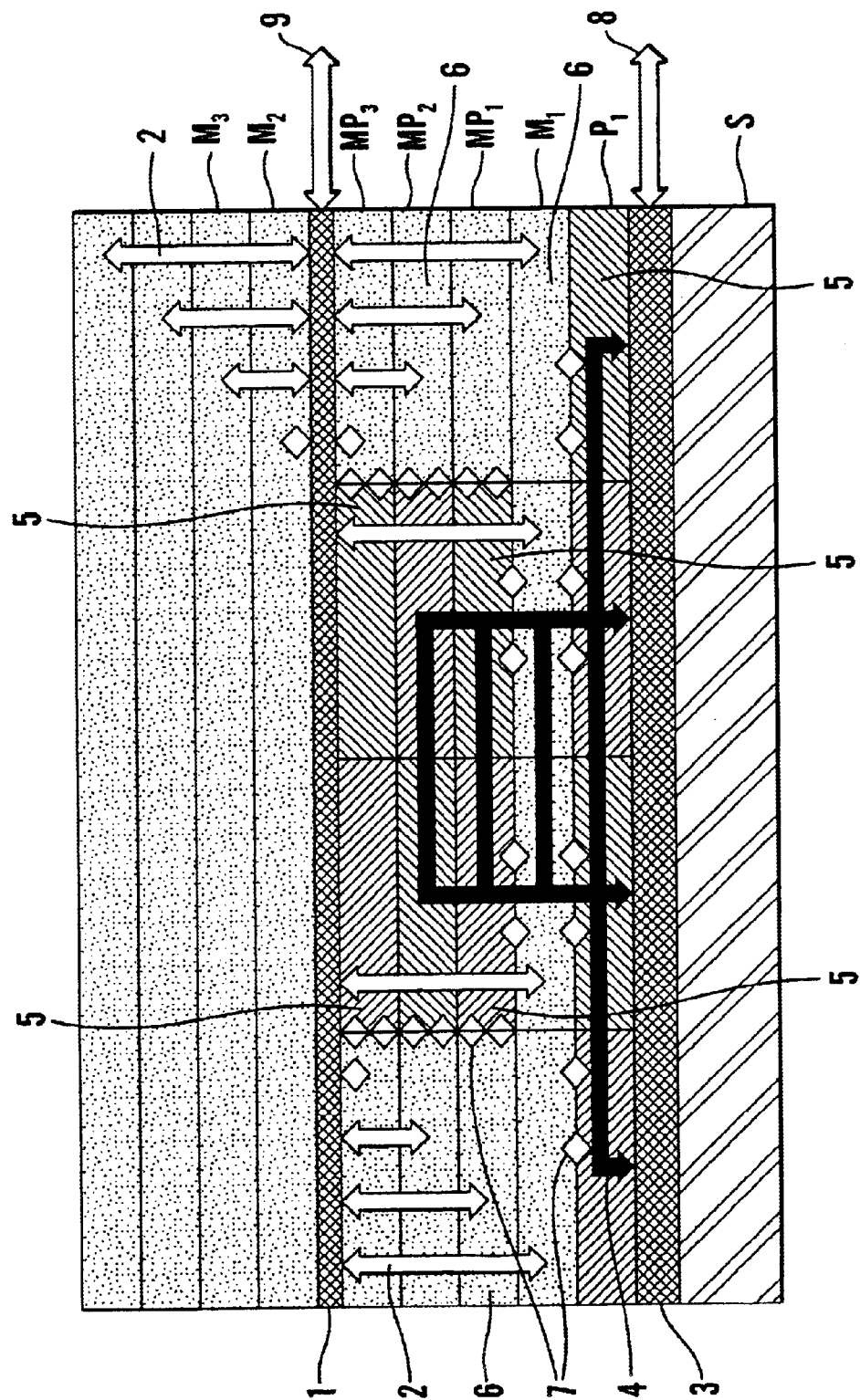

The invention shall now be explained in more detail in connection with examples of embodiments and with reference to the accompanying drawings wherein the same reference number normally denotes similar parts, but wherein similar parts not everywhere have been provided with reference numbers, and wherein FIG. 1 which has already been mentioned, schematically shows an IRAM with vector microprocessor according to prior art, FIG. 2 schematically and in principle the data processing device according to the present invention integrated in the form of stacked layers, FIG. 3 schematically a first embodiment of the data processing device according to the invention, FIG. 4 schematically a second embodiment of the data processing device according to the invention, FIG. 5 schematically a third embodiment of the data processing device according to the invention, FIG. 6 schematically a fourth embodiment of the data processing device according to the invention, FIGS. 7a, b schematically respectively in plan view and cross section a memory which may be used in the storage unit in the data processing device according to the invention.

Figure 7A:
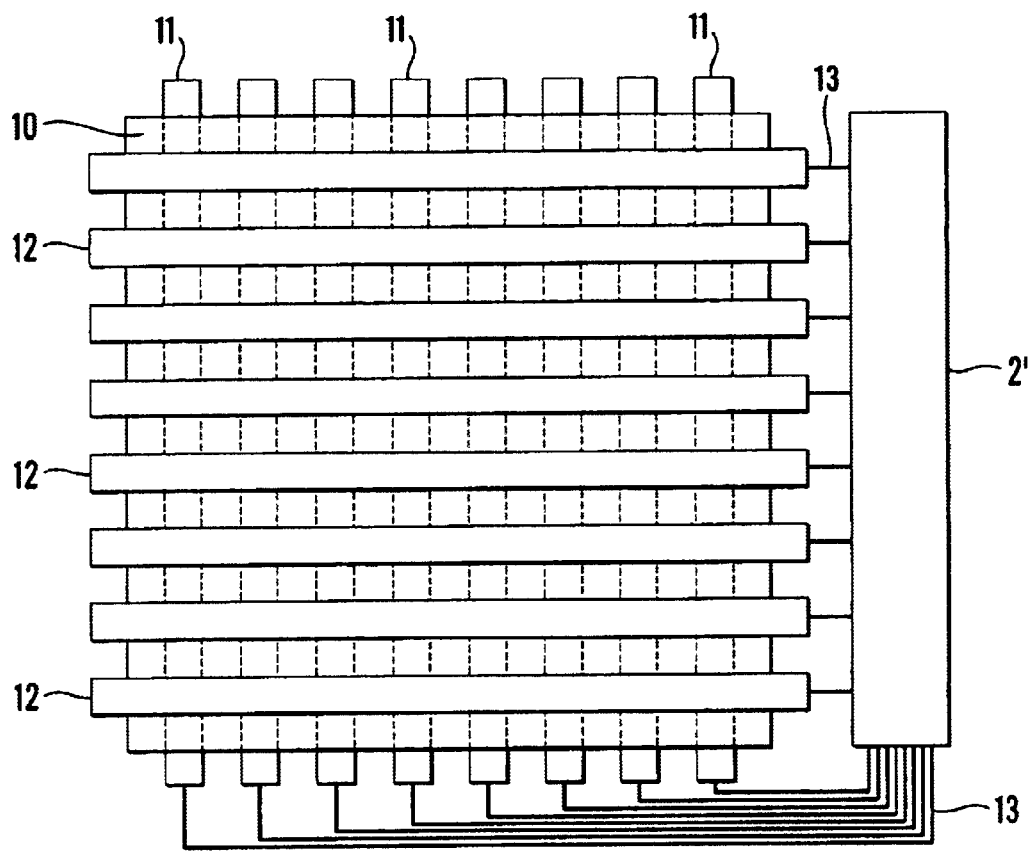
Figure 8A:
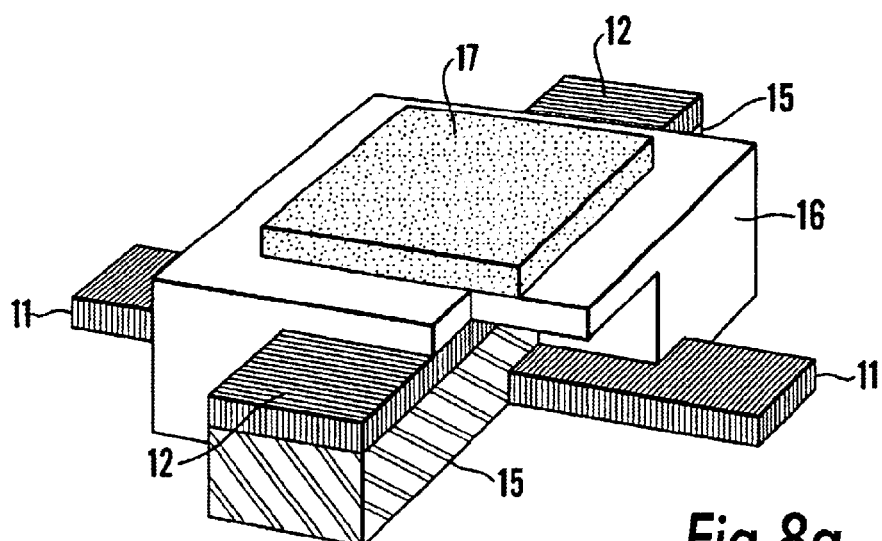
Figure 8B:
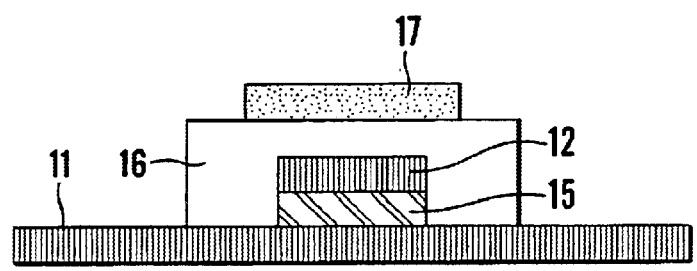
Figure 8C:
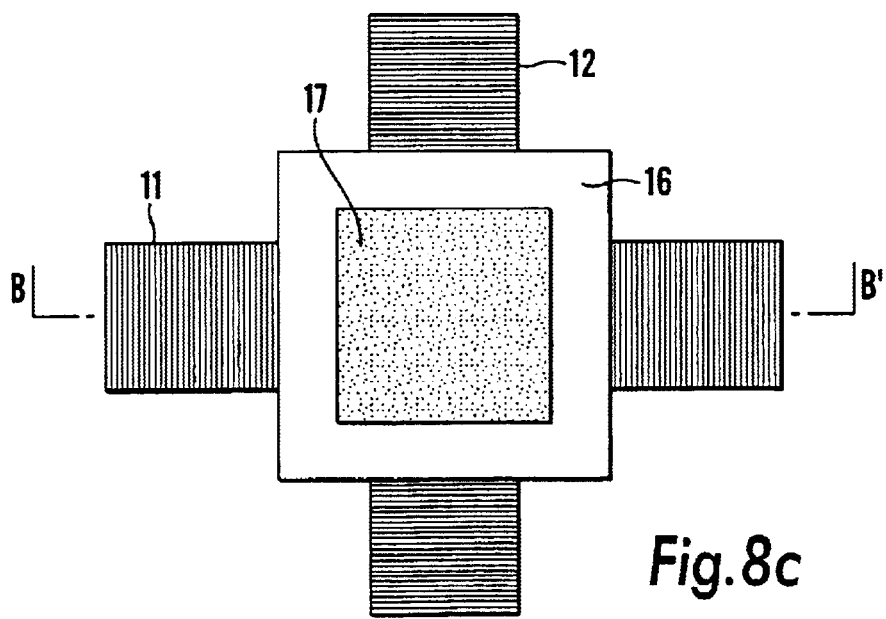
Figure 9:
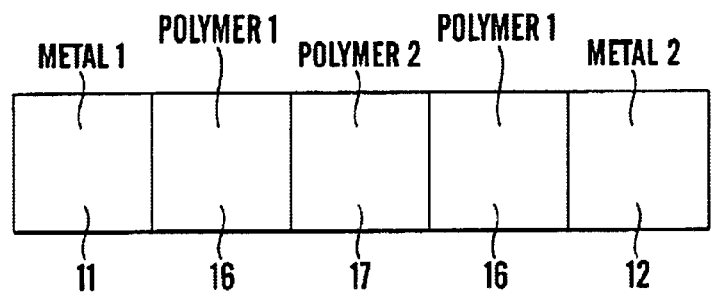
Figure 10:
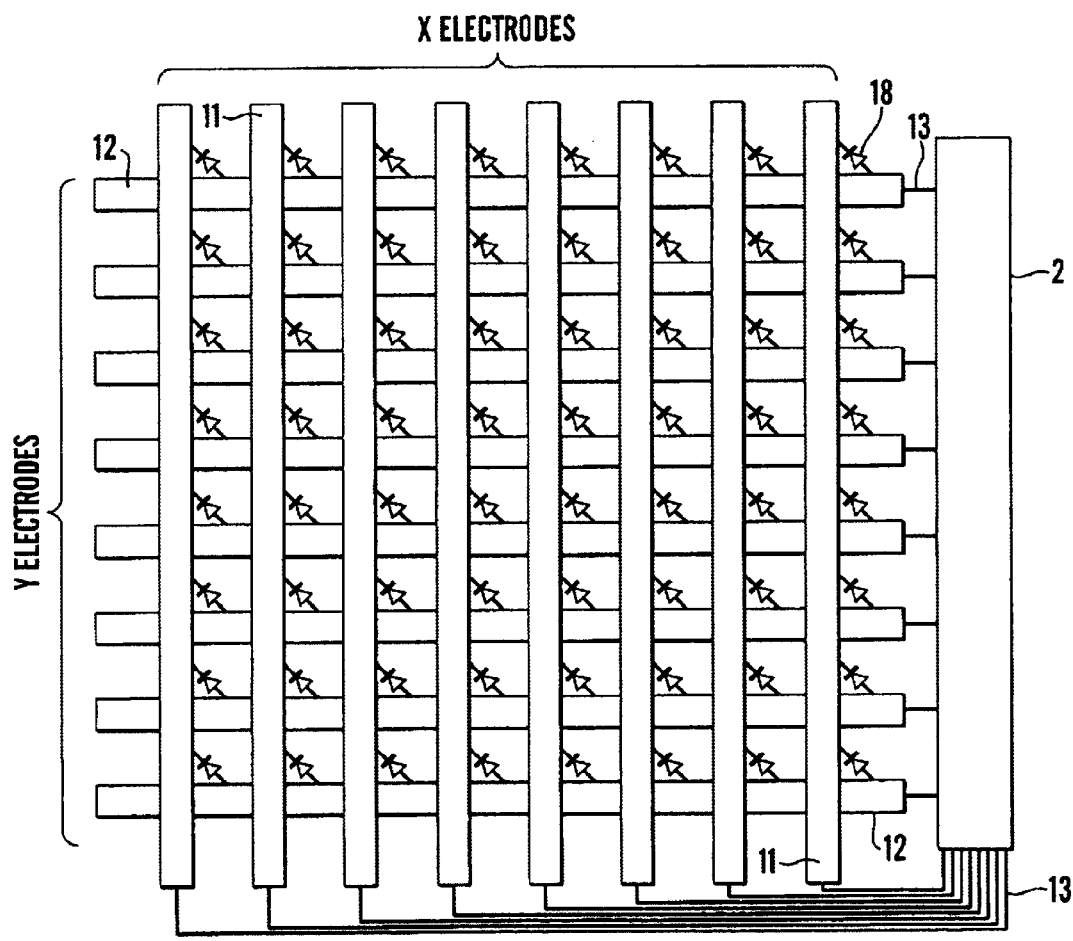
Figure 11:
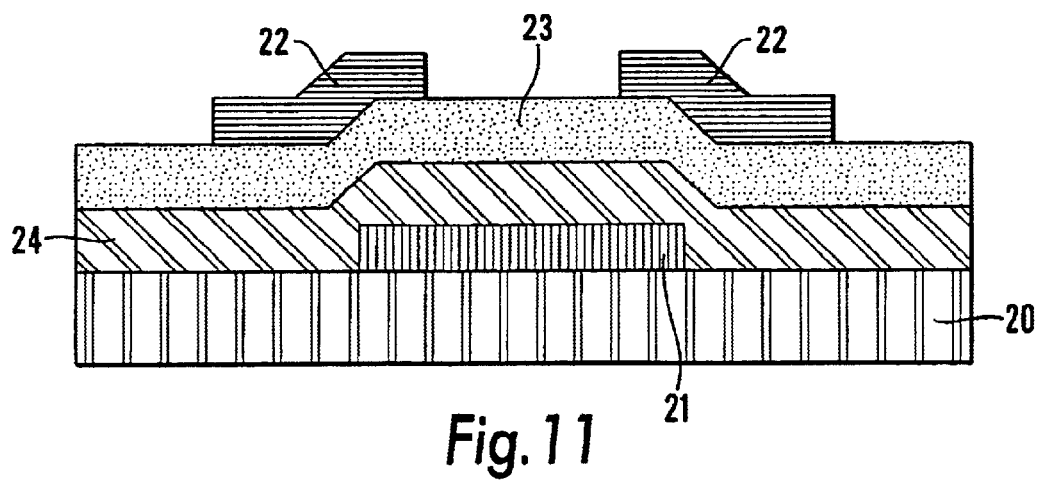
Figure 12:
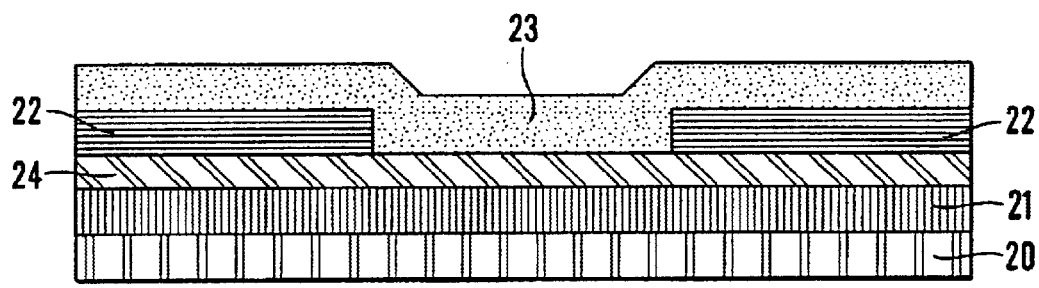
Figure 13:
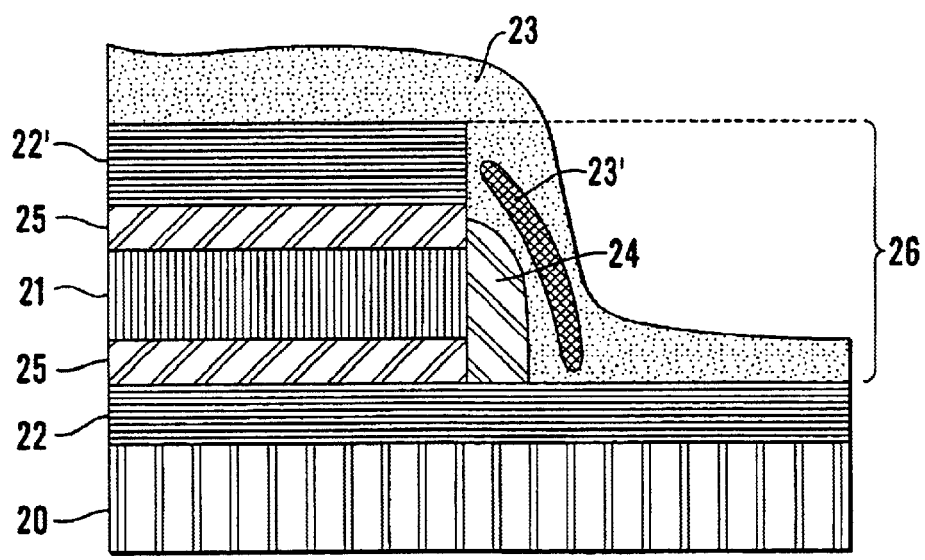
Figure 14:
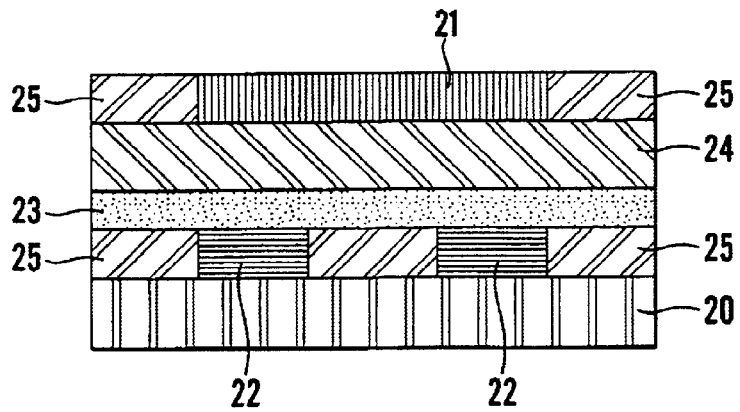
Figure 15:
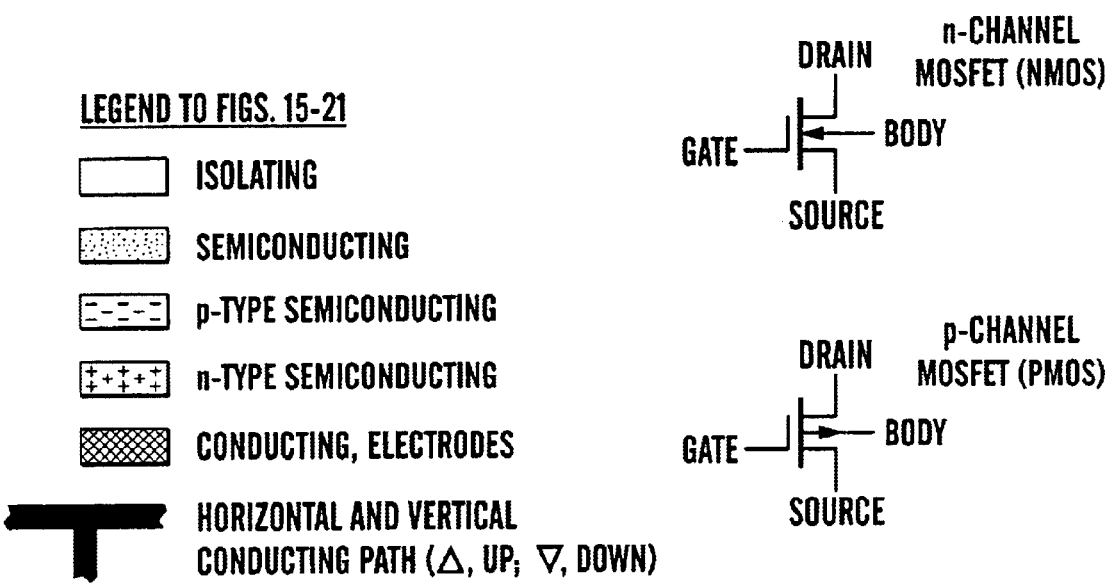
Figure 15:
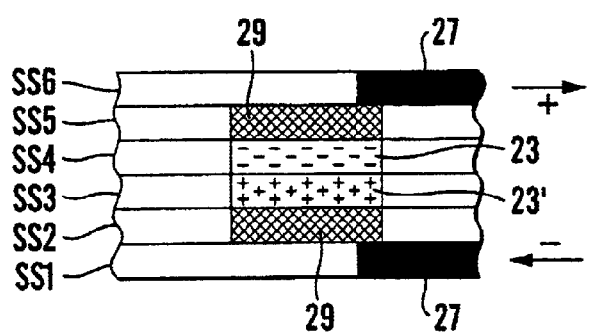
Figure 16:
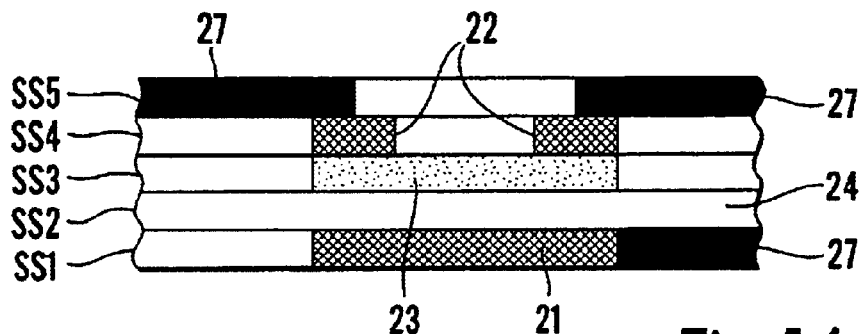
Figure 17A:
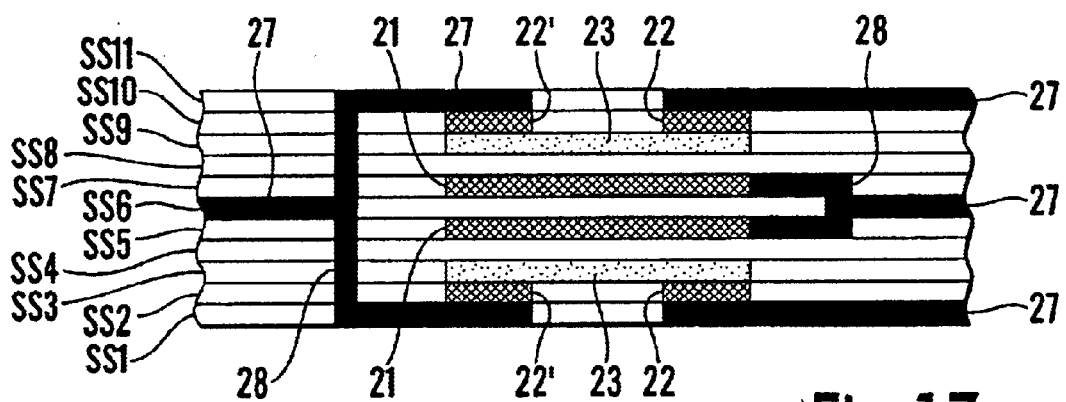
Figure 17B:
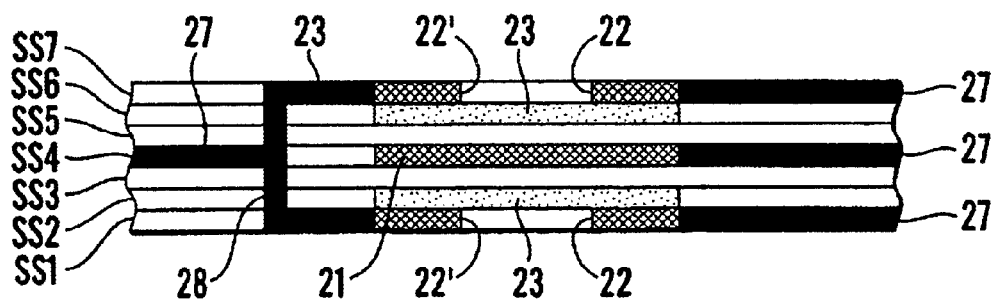
Figure 18:
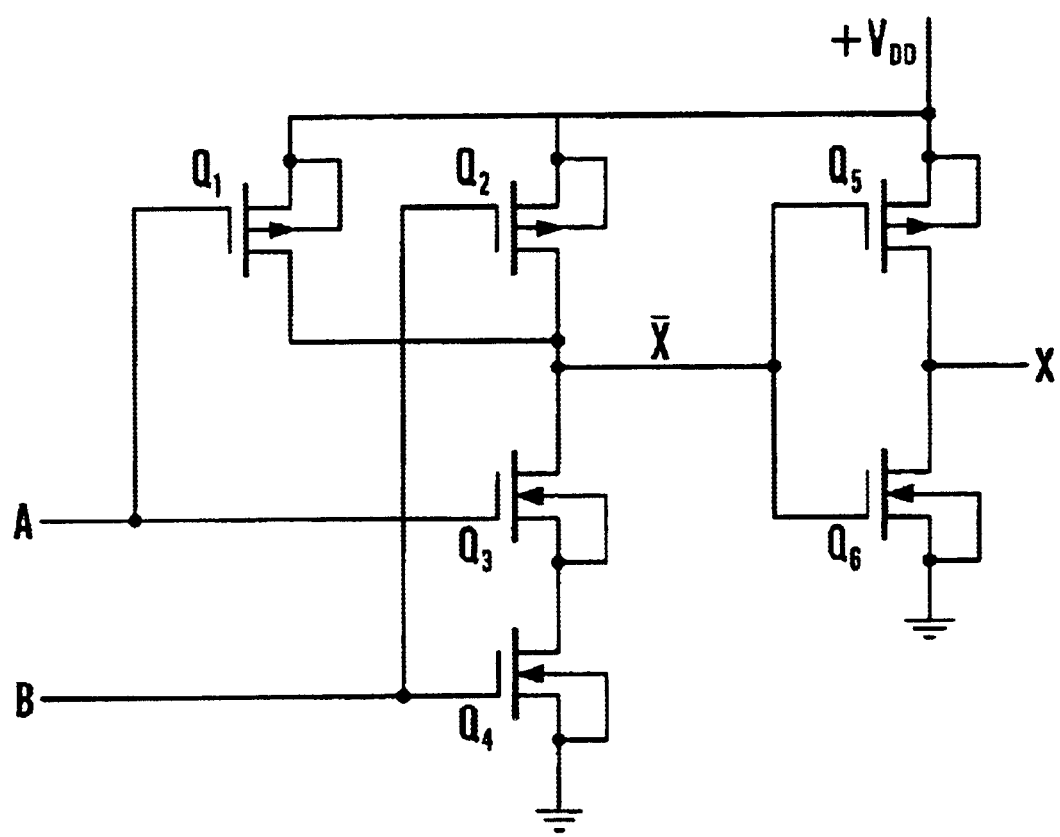
Figure 19A:
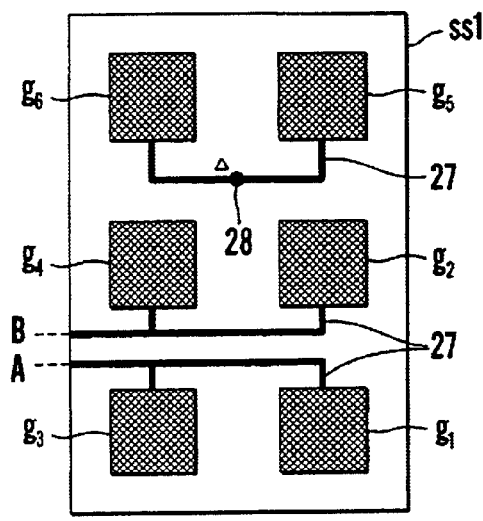
Figure 19B:
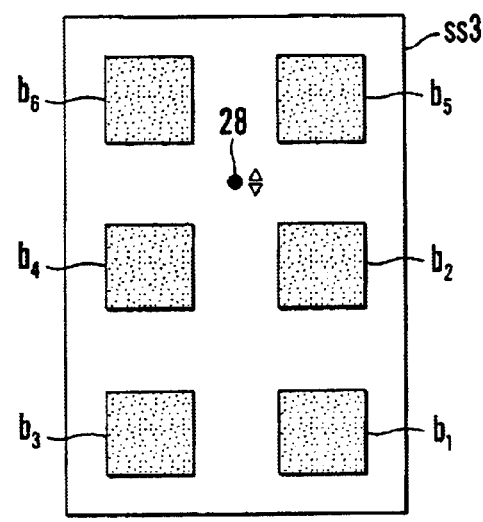
Figure 19C:
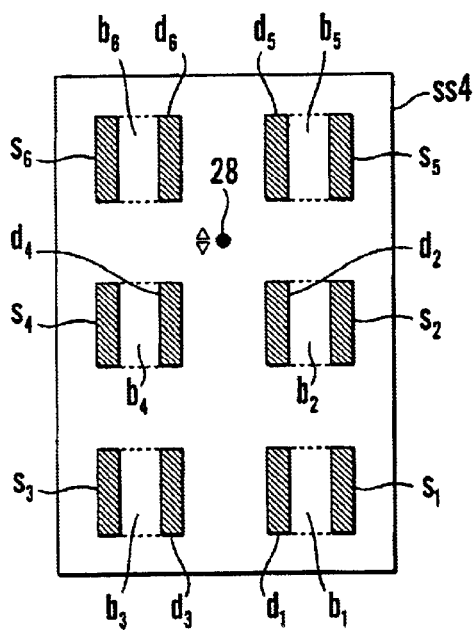
Figure 19D:
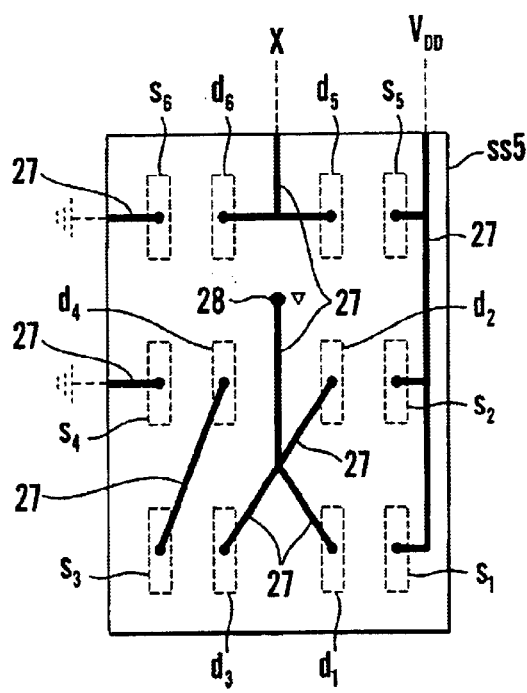
Figure 20:
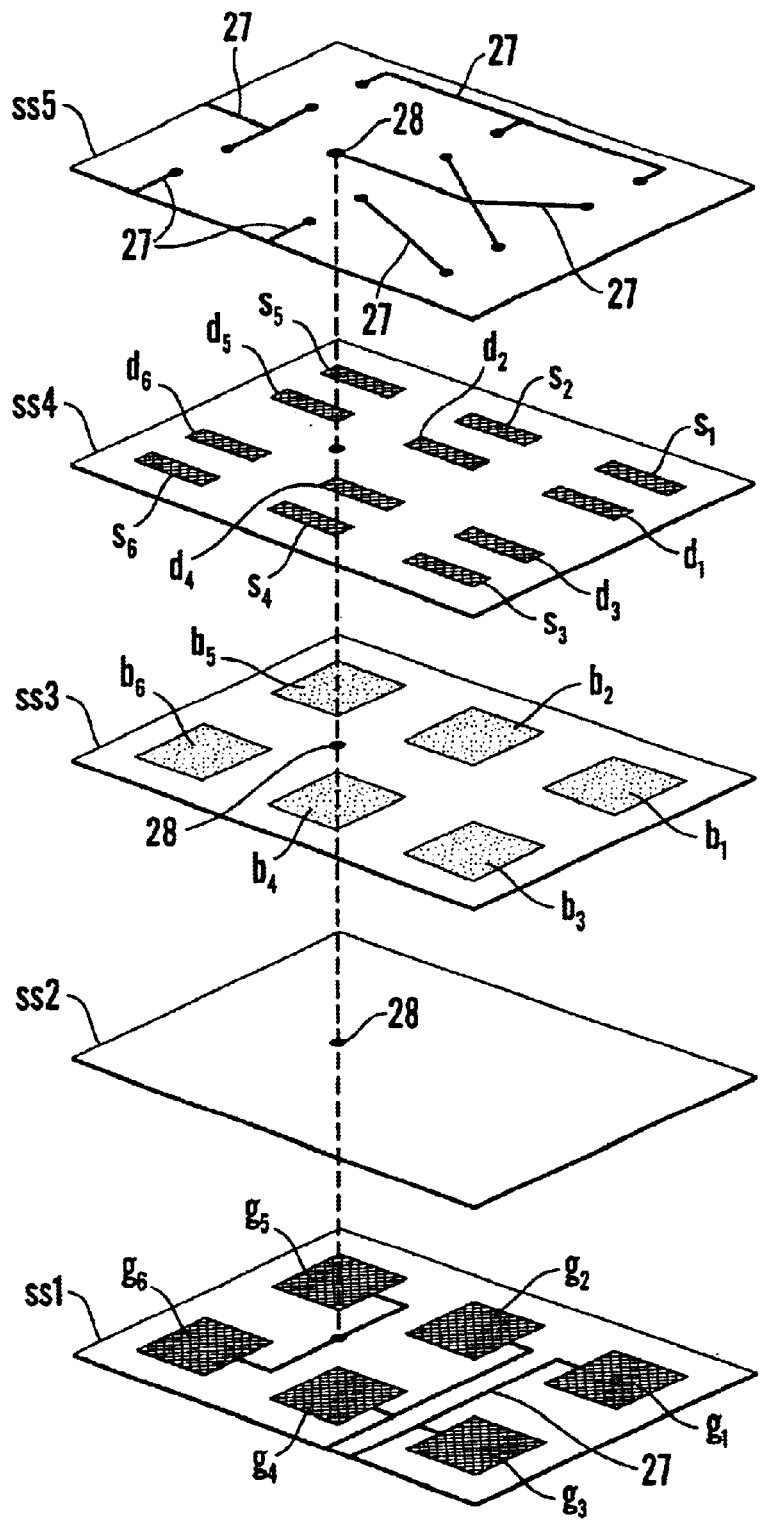
Figure 21A:
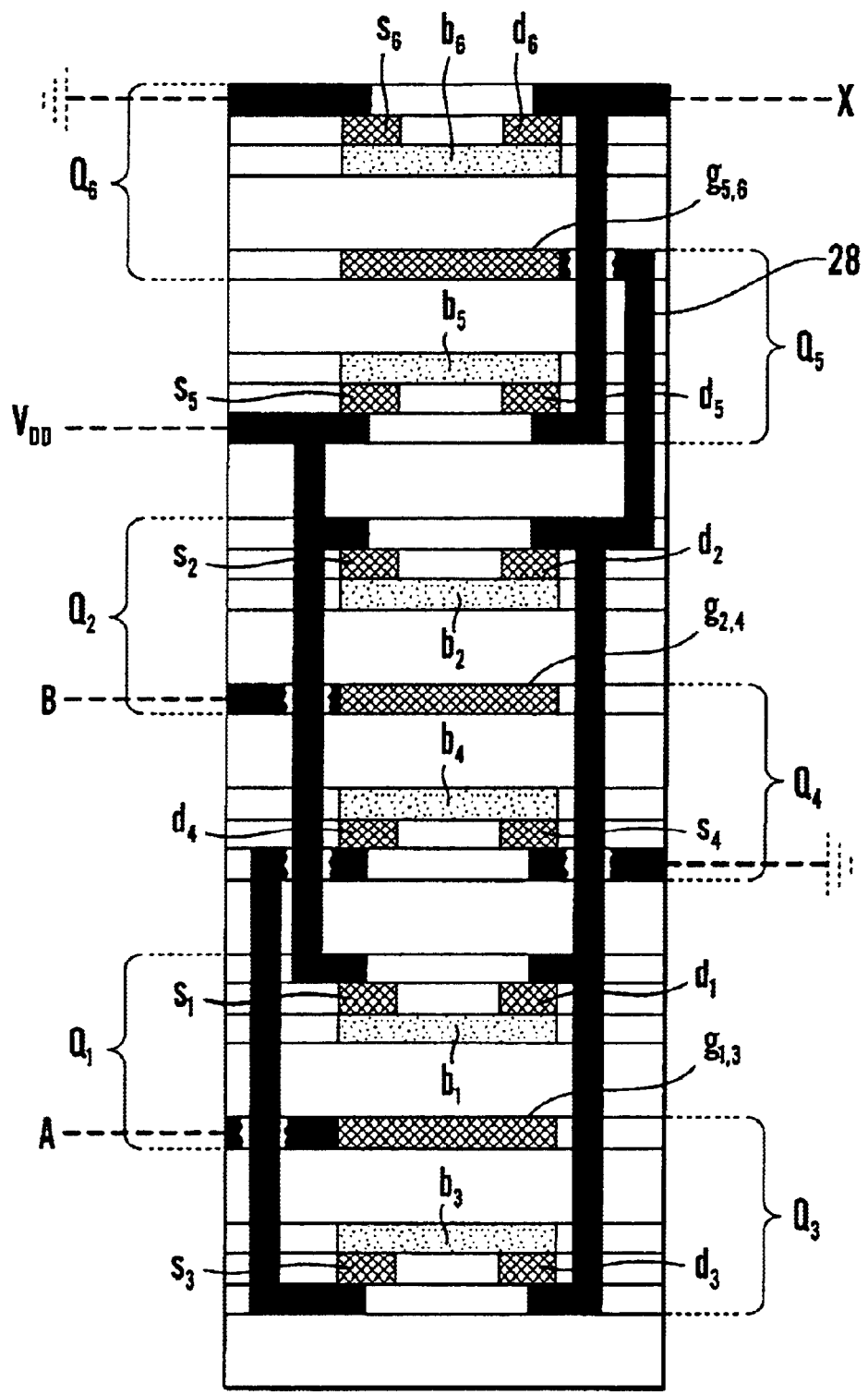
Figure 21B:
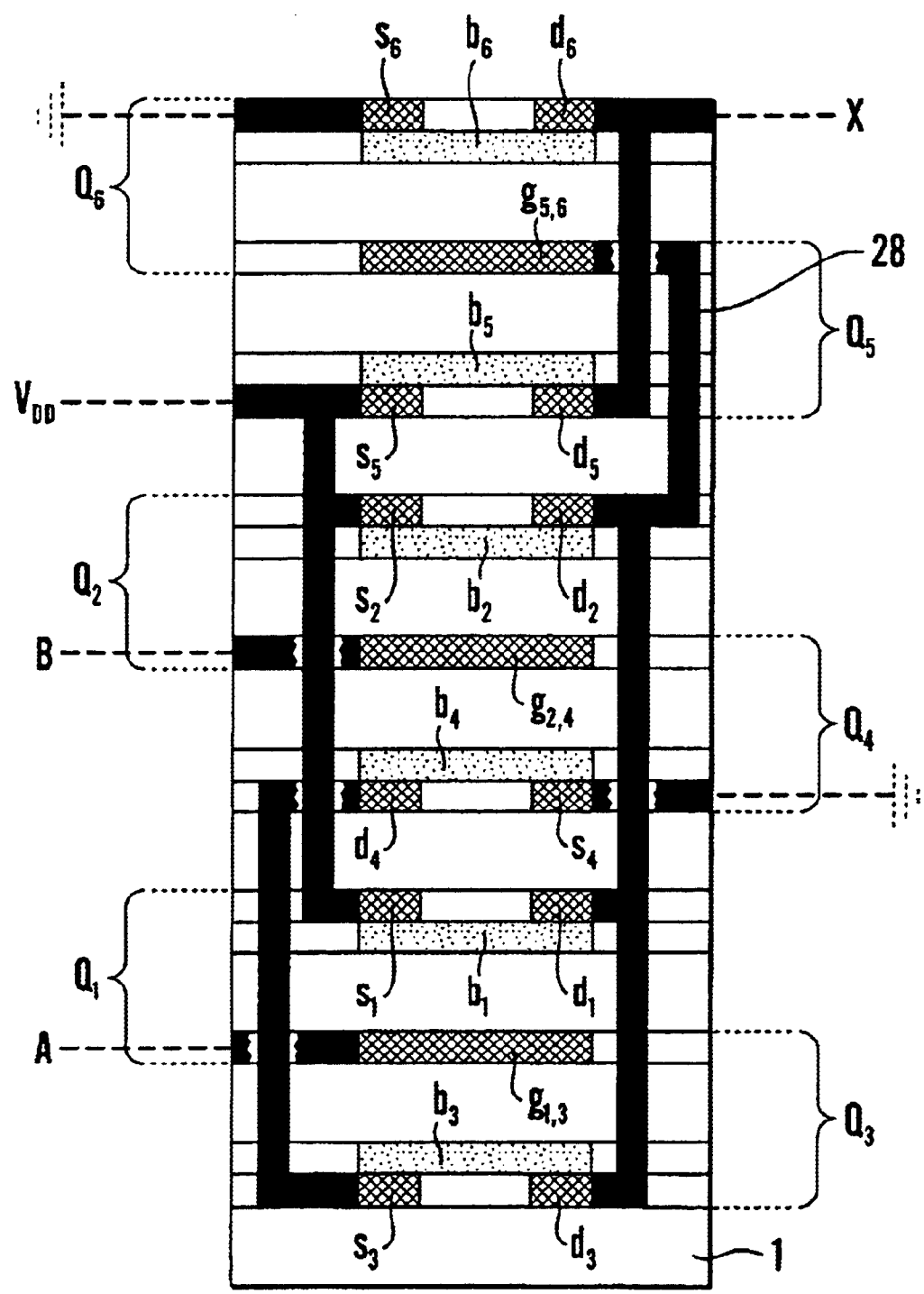
Figure 22:
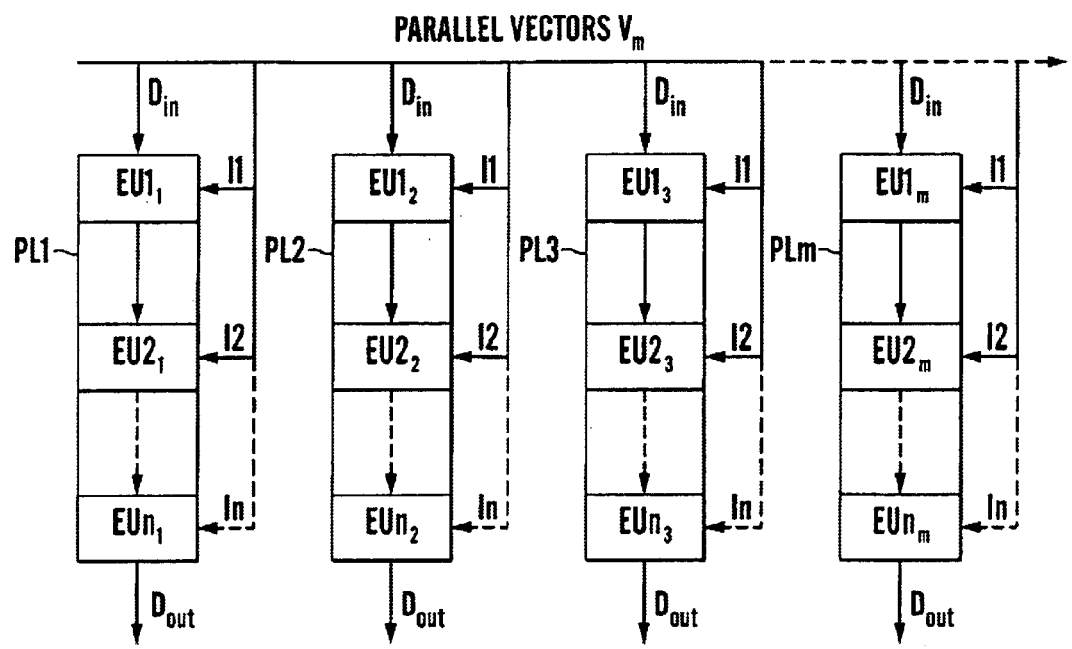
Figure 23:
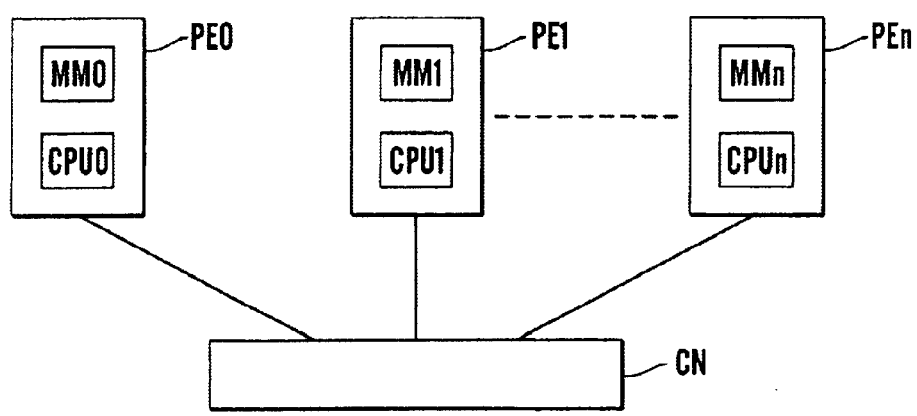
Figure 24:
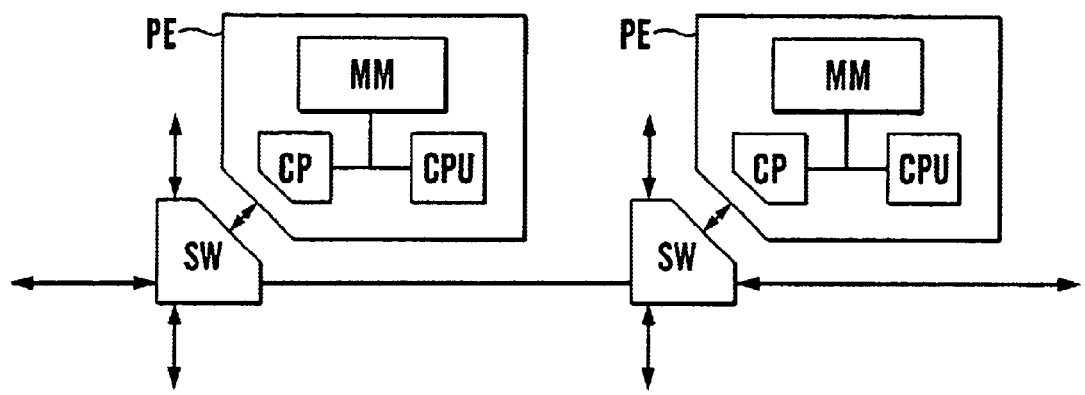
Figure 25:
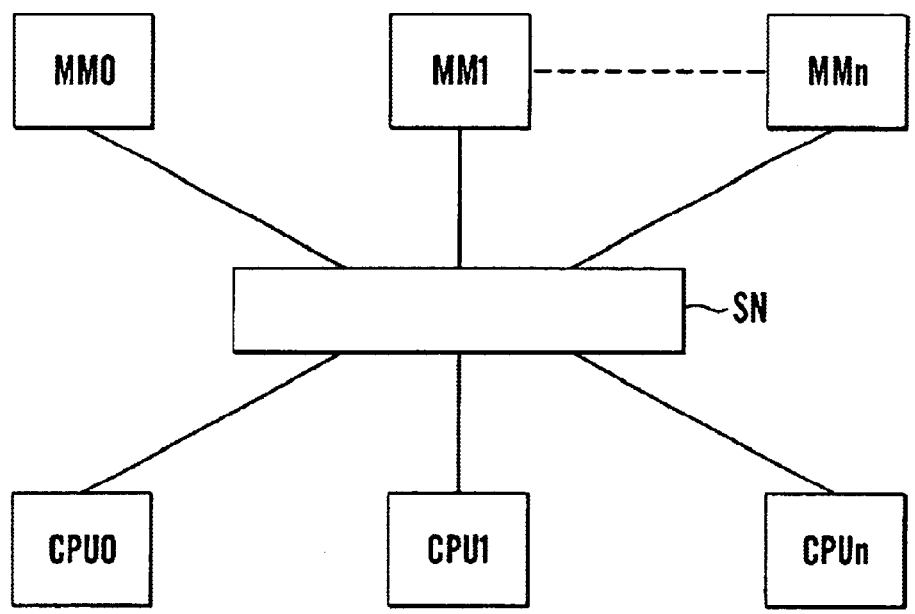
Figure 26:
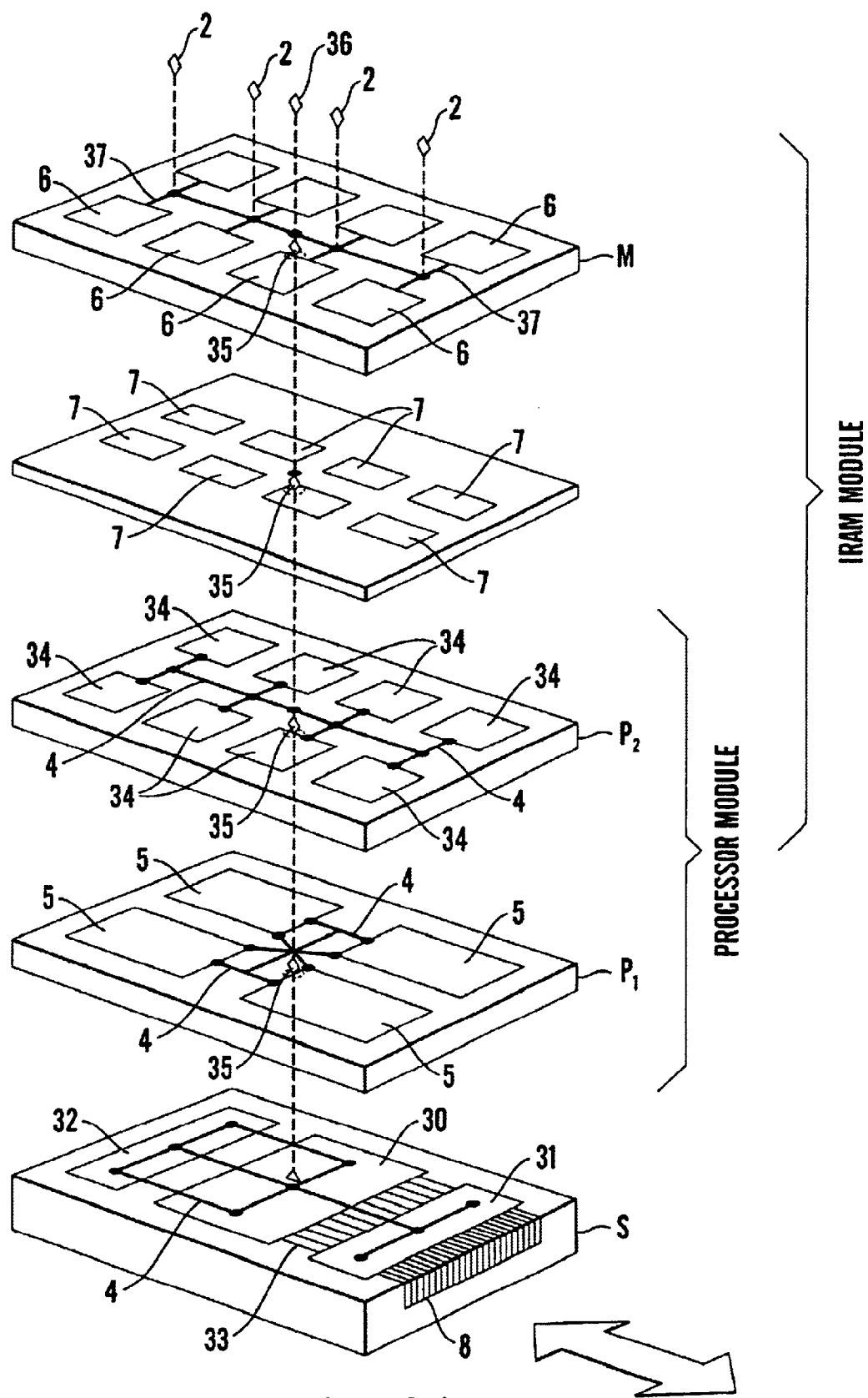

FIGS. 7c, d sections through a first embodiment of a memory element in the memory in FIG. 7a, FIG. 7e a section through a second embodiment of a memory element in the memory in FIG. 7a, FIG. 7g a section through a storage unit comprising several stacked memory layers, FIG. 7h a detail of the storage unit in FIG. 7g, FIGS. 8a, 8b, 8c respectively in perspective, section and plan view a third embodiment of a memory element which may be used in the memory in FIG. 7a, FIG. 9 the fundamental embodiment of the memory element shown in FIG. 8, FIG. 10 schematically the electrode matrix used in the memory in FIG. 7a and with use of memory elements in the embodiment as shown in FIG. 8, FIG. 11 a first field effect transistor (FET) which may be used in the data processing device according to the invention, FIG. 12 a second field effect transistor which may be used in the data processing device according to the invention, FIG. 13 a third field effect transistor which may be used in the data processing device according to the invention, FIG. 14 is a fourth field effect transistor which may be used in the data processing device according to the invention, FIG. 15 a schematic section through a diode structure generated by a conversion of layer material and which may be used in the data processing device according to the invention, FIG. 16 a schematic section of a MOSFET structure generally by conversion of the layer material and which may be used in the data processing device according to the invention, FIG. 17a a schematic section through a logic inverter structure which employs the MOSFET structure in FIG. 16 and which may be used in the data processing device according to the invention, FIG. 17b a schematic section through a variant of the inverter structure in FIG. 17a, FIG. 18 the equivalent diagram of an AND gate realized in CMOS technology, FIGS. 19a–d in plan view the sublayers in an AND gate structure realized in thin-film technology and according to the equivalent diagram in FIG. 18 with the use of MOSFET structures as the one shown in FIG. 16, FIG. 20 the stacked AND gate structure in FIG. 19, but exploded in the separate sublayers, FIG. 21a schematically another variant of the AND gate structure in FIG. 20, where the separate MOSFET-structures are provided above each other in vertical configuration and mutually paired with common gate electrode, FIG. 21b schematically a variant of the embodiment in FIG. 21a, FIG. 22 schematically a processor architecture which combine data parallelism and function parallelism and which may be used in the data processing device according to the invention, FIG. 23 schematically the principle of an MIMD architecture with distributed memory system, FIG. 24 schematically a more practical embodiment of the MIMD architecture in FIG. 23, FIG. 25 schematically the principle of an MIMD architecture with shared memory system, and FIG. 26 how the MIMID architecture in FIG. 25 may be realized in the data processing device according to the invention.

The starting point of the present invention is that the data processing device according to the invention can be realized in the form of mutually adjacent, substantially parallel stacked layers, preferably composed by several sublayers which specifically realize determined electrical properties in the main layer, and that neither the processing unit nor the storage units apart from in one or a few layers, shall employ active devices in a large degree. That is realizable with use of novel materials and architectures which shall be discussed more closely in the following. In its most schematic form this is shown in FIG. 2, where a multilayer structure consisting of respectively a processor layer P and a number of memory layers $M_1, M_2 \ldots$ is provided on a substrate S. The substrate S may for instance be made of silicon and the thereabove provided layers P realize the processor layer wherein at least a central processing unit (not shown) is included and possibly one or more control and communication processors. The processor layer hence will comprise active components and may well be realized in inorganic semiconductor technology, for instance on a silicon substrate. Above the processor layer the different memory layers $M_1, M_2 \ldots$ which constitute the storage unit in the data processing device are provided in stacked configuration, the separate memories being provided in each separate memory layer and configured as for instance RAM, ROM, ERASABLE or REWRITEABLE, the last-mentioned concept covering both erasable and over-writeable memories. It is to be understood that each layer P, M in the data processing device in FIG. 2 comprises electrical conducting structures, either horizontal or vertical, which provide connection between the components in each layer and the layers themselves. This shall be discussed more closely in the following.

FIG. 3 shows more explicitly a fist embodiment of the data processing device according to the invention and substantially realized on the first level of the functional hierarchy. Here once again the processor layer P is provided on a substrate S and will as before include active components such as transistors in order to realize one or more central processors and possible control and communication processors. Above the processor layers P a memory interface 1 is provided and extends beyond the processor layer P and over the substrate S. Above the memory interface memory layers $M_1, M_2 \ldots$ are provided. Both the processor layer P and the memory layers M and memory interface 1 comprise not shown horizontal electrical conducting structures to provide connection between the separate components, but in addition these conducting structures are in the memory M conveyed to electrical edge connections at the side of the memory layer and the memory buses 2 which are provided in a separate memory bus module 2' as shown in the figure. For each memory layer $M_1, M_2 \ldots$ there are provided corresponding memory buses $2_1, 2_2 \ldots$ and they may in their turn be generated as both horizontal and vertical electrical conducting structures in the memory bus module 2'.

FIG. 4 shows another embodiment of the data processing device according to the invention. As before the processor layer P is provided on the substrate S, while the memory interface 1 is provided above the processor layer P and covers this without contacting the substrate S. The separate memory layers $M_1, M_2 \ldots$ are provided above the memory interface 1, but in this embodiment a separate memory bus module has been renounced. Instead the memory buses 2 are in their entirety generated as vertical electrical conducting structures which extend to the memory layers $M_1, M_2 \ldots$ and provide connection to the memory interface 1. The memory buses 2 provide connection to not shown addressing lines for memories in the storage unit, as the addressing lines may be provided in the form of horizontal electrical conducting structures in each memory layer M. Preferably, the memory layer $M_1$ which is located closest to the processor layer P is realized with write/read memories (RAM) such that the signal paths between RAM and the processor layer P become as short as possible. The memory layer $M_1$ may be realized with a number of RAMs and the I/O port of each RAM is provided on memory buses $2_1$ particularly provided for each RAM, such this is shown in the figure. The remaining memory layers $M_2 \ldots$, which may be present in a very large number can realize the mass memory of the data processing device. It is, however, to be understood that in principle it needs not to be any difference between the physical realization of respectively RAMs and the mass memory, as the memory in the separate memory layers can be realized in precisely the same technology. Similar to RAM the mass memory hence may be realized with memories which in their entirety are realized as write/read memories, ERASABLE or REWRITEABLE, but may also comprise memories of the type WORM (Write, Once, Read Many Times).

Preferably are the separate layers according to the invention as mentioned realized in the form of a number of thin sublayers in a technology and with materials which make it possible to realize the layers as combined processor and memory layers and one or more layers substantially as memory layers. This is to be discussed more closely in the following. It may in that connection be appropriate that the technology which is used for realizing the layers for this purpose forms a functional hierarchy, wherein the first level in the functional hierarchy configures the layers functionally as either combined processor or memory layers or as separate processor or memory layers. The second level in the functional hierarchy will then configure the processing unit functionally as one or more processor or parts of processors and these may as required constitute one or more central processing units and microprocessors in the data processing device, and if necessary dedicated processors or possibly be configured as respectively control and/or communication processors. On the third level of the functional hierarchy the technology applied implements the architecture of the separate processor, for instance the central processing unit as a parallel processor with several execution units working in parallel. Correspondingly the applied technology in the second level of the functional hierarchy will configure the storage unit functionally as one or more memories or parts of memories. On the third level of the functional hierarchy one or more memories may be realized as RAMs and then be connected with one or more central processing units, and possible further memories may optionally be configured as high-speed memories, ROM, WORM, ERASABLE and REWRITEABLE. These memories may then be included in the mass memory of the storage unit and if they are configured as ERASABLE or REWRITEABLE, they may in reality be able to work as RAMs, but with far larger storage capacity than which is the case for conventional RAMs. However, there is nothing against that the applied technology may be used for realizing RAMs with the storage capacities which far exceed today's dynamic RAMs based on inorganic semiconductors, and at least for realizing RAMs with a storage capacity which approaches the mass storage capacity of common PCs.

The above-mentioned features and advantages are realizable by the data processing device according to the invention substantially being based on components realized in thin-film technology. Particularly in that connection will the sublayers appear as separate thin-films and may be combined, for instance by lamination into main layers, that is processor layers and/or memory layers. In the active components such as the transistors in the processors semiconducting thin-film materials may be used and which may be inorganic, organic, amorphous or polycrystalline.

In the memory materials and logic devices a non-volatile thin-film material may be used, such that these components maintains a given logic state in case of interruption in the power supply.

Particularly the thin-film materials which are used for realizing memories in a memory layer may be such they spontaneously form diode junctions and they may in addition also be based on anisotropic conducting thin-film materials. This will make possible addressing schemes where the memories are configured as electrically addressable passive matrices which make possible high storage density and a large storage capacity without any active components being necessary. Particularly the whole memory layer may in each separate case be realized in the form of memory modules embodied in thin-film technology. Technically it is well-known how this may be realized, for instance by successive deposition of the separate layers on a common substrate, or by joining separate ultra-thin self-supporting layers. This shall also be discussed in more detail in the following.

There shall now with reference to FIG. 5 be described a third embodiment of the data processing device according to the invention, as FIG. 5 shows a more completely rendered embodiment. In this embodiment several processor layers P are used. The first of these processor layers $P_1$ is provided adjacent to a processor interface 3 which is located closest to the substrate S. Interfoliated between a first $P_1$ and second processor layer $P_2$ which, such this is indicated in the drawing, may comprise several processors 5, a first memory layer $M_1$ and one or more RAMs 6 assigned to the processor 5 in the processor layer $P_1$ are provided. Above the memory layer $M_1$ the second processor layer $P_2$ follows with several processors 5 and assigned thereto a memory layer $M_2$ with one or more RAMs 6 assigned to the processor in the processor layer $P_2$. Above the memory layer $M_2$ now follows a third processor layer $P_3$ which again may comprise several processors 5 and then follows the memory layer $M_3$ with one or more RAMs 6 assigned to the processors in the processor layer $P_3$. It is to be understood that the number of processor layers P with assigned RAM layers $M_1$, $M_2$, $M_3$ may well be larger than 3, and that the embodiment as shown in FIG. 5, of course is purely schematic and exemplifying.

Above the memory layer $M_3$ a memory interface 1 is provided and above this follows further memory layers $M_4$, $M_5$ . . . in a very large number and may well realize a mass memory in the data processing device. These further memory layers $M_4$, $M_5$ is via memory buses 2 realized in the form of vertical electrical conducting structures, conveyed to the memory interface 1. Correspondingly are the separate RAM in the memory layers $M_1$, $M_2$, $M_3$ also conveyed to the memory interface 1 hrough the separate layers extending via vertical memory buses 2. In addition memory buses 7 which leads to the I/O ports on the separate RAMs are provided between the processors 5 in the processor layers $P_1$, $P_2$, $P_3$ and assigned RAM in the memory layers $M_1$, $M_2$, $M_3$. For each processor 5 two such memory buses 7 are drawn for symbolically to indicate separate instruction and data buses. This is of course no condition. The processor interface 3 is connected to possible external units over an I/O-bus 8 and correspondingly it is for the memory interface 1 provided an I/O-bus 9.

In the embodiment as shown in FIG. 5 is provided particularly a data processing device which according to the invention is configured with a number of processors 5 and at least the corresponding number of RAMs assigned to the processors. By configuring the processing unit with several processors and providing each processor with one or more RAMs, where the vertical configuration of the data buses simultaneously allows a very large transfer rate, it will to a large degree be possible to solve the latency problems even with large bandwidths for the I/O-ports of RAMs.

When the RAMs additionally are implemented with technologies which shall be discussed in more detail in the following, particularly technologies which allow addressing in parallel and with full exploitation of a very large transfer bandwidth even with very high cycle time, the problem with the above-mentioned gap between high processor performance and long access time can be eliminated. In reality there may in a suitable architecture be realized a data processing device with several processors working in parallel, such that with an appropriate embodiment of the separate processor, for instance by using parallel processing also in the processor itself, an integrated data processing device is realized with a capacity which approaches or exceeds known supercomputers implemented in conventional technology. For this purpose it is as shown in FIG. 5 provided a processor bus 4. As will be mentioned below, the use of several processors 5 which possibly can work in parallel and which are mutually connected over the processor bus 4 and in addition provided in close connection to one or more RAM, not only an embodiment which in a large degree eliminates the latency problems, but also due to the volumetric embodiment of the data processing device allows optimal interconnectivity between processors and the appurtenant RAMs. If the network of the processors 5 and RAMs 6 is embodied as shown in FIG. 5, it may be configured dynamically in order to provide a capacity which are optimally adapted to a given task. The configuring may for instance take place with a particular, not shown control processor which advantageously may be provided in the processor interface 3 whereto the processor bus 4 is connected.

As mentioned above, the processors do not need to be provided in separate layers or processor layers P, and correspondingly neither all memories in the storage unit need to be provided in separate layers or memory layers M. Appropriately processors and memories, for instance RAMs assigned to the processors, may be provided in one and the same layer, such this is shown in FIG. 6 which also shows embodiment of the data processing device according to the invention. Once again a processor interface 3 with an I/O-interface 8 is here provided on a substrate S, and above this processor interface 3 follows a processor layer $P_1$ with one or more processors. Both the processor interface 3 and the processor layer $P_1$ may as the lowermost layers in the data processing device in FIG. 6 and adjacent to the substrate be realized in conventional, for instance silicon-based semiconductor technologies. A first memory layer $M_1$ which may be configured with one or more RAMs 6 assigned to the processors 5 in the underlying processor layer $P_1$, is provided above the latter. In FIG. 6, however, the separate RAM 6 in the memory layer $M_1$ is not particularly emphasized. On the other hand it is shown how memories in the memory layer $M_1$ may be directly connected to the underlying processor layer $P_1$ via buses 7, as the stacked configuration allows such buses 7 to be provided in large numbers by being embodied as vertical conducting structures and the configuration layer on layer allows that a very large number of such bus connections to be provided between the processor layer $P_1$ and memory layer $M_1$ and in addition with short signal paths. A juxtaposed arrangement in a surface would in contrast require longer path connections and hence longer transfer times. Further there are in the data processing device in FIG. 6 provided combined memory and processor layers $MP_1$, $MP_2$ and $MP_3$ equipped with processors connected mutually and to the processor interface 3 via the same processor bus 4. All the combined memory and processor layers MP may comprise one or more processors 5 and one or more RAMs 6. Above the combined memory and processor layers MP there is as before provided a memory interface 1 with an I/O-interface 9 to external units, and above the memory interface 1 follow memory layers $M_2$, $M_3$ etc. in as a large number as desired and possibly realized as the mass memory of the data processing device. These memory layers $M_2$, $M_3$ are in their turn connected to the memory interface 1 via memory buses realized as vertical conducting structures 2 through the layers $M_2$, $M_3$ . . . .

In FIG. 2–6 the data processing device according to the invention is shown as a section through the different layers of the device, but it is to be understood that the layer-wise structure of the data processing device actually realizes volumetric configurations where for instance the vertical current conducting structures 2 may be provided distributed over the surface and hence provide a large number of connections between memories and processors and accompanying interfaces, and similarly that for instance the processor bus 4 in each case extends both horizontally and vertically in the different layers and may connect processors which are distributed with one and the same layer or on different layers in a three-dimensionally configured network. In that connection it shall also be remarked that when the expression "horizontal" and "vertical" is used for the electrical conducting structures, it shall by this be understood that the first-mentioned concept everywhere implies that the conducting structure extends along the layer and substantially parallel with the upper and lower side thereof, and correspondingly that the second concept everywhere means that the structure extends substantially perpendicularly to the upper and lower side of the layers and transversing these. Purely practically may consequently also "horizontal" and "vertical" refer to the orientation of the layers in relation to the underlying, substantially planar substrate, as the layers not only are mutually parallel, but also extends in parallel in relation to the surface of the substrate S.

In principle there is nothing against that the data processing device according to the invention, apart from the substrate, wholly may be realized with substantially organic materials, possibly metal-organic complexes and implemented in thin-film technology. Purely practically it may be an advantage to provide a processor interface 3 and the lowermost processor layer $P_1$ adjacent to the substrate S, such that one possibly is free to realize the components in these layers in conventional and well-known semiconductor technologies, for instance based on silicon. It is, however, nothing against that these layers, of course, may be realized in an organic thin-film technology.

How memories in the storage unit may be realized in practice will now be described more closely in the following. Similarly, examples of embodiments of active components, such as for instance transistors and conducting structures, shall be mentioned, wherein also different suitable materials and technologies for implementing these components briefly will be discussed. It will then more clearly also be evident that the data processing device in the embodiments as shown in FIG. 2–6 may be realized with technologies which either is available or for the time being are under development, among other by the applicant.

Figure 7B:
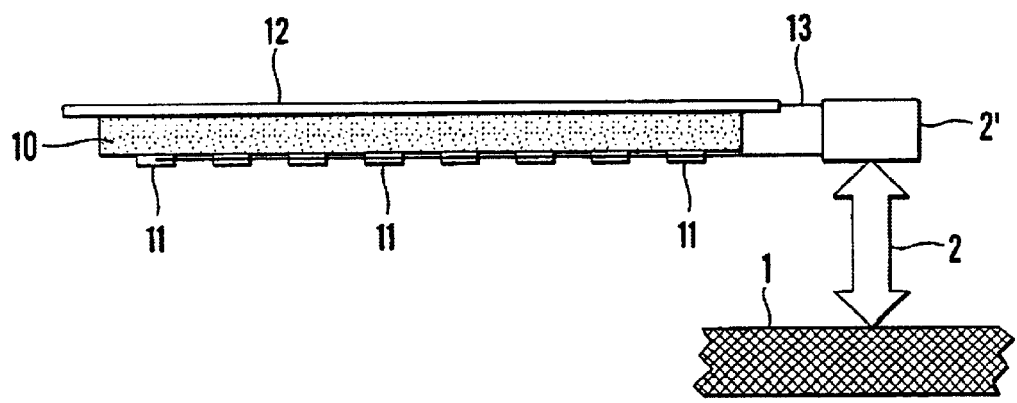

I NO patent application No. 972803 which has been assigned to the present applicant and which hereby is incorporated as reference, there is disclosed an electrically addressable logic device suitable for storage or processing of data. An embodiment of this device configured as a data memory is shown in FIG. 7a. The memory comprises a memory medium 10 which forms a layer-like continuous structure which can be realized as a layer in one of the memory layers M in the present invention. The memory medium 10 is formed by a substantially organic material which may go through a physical or chemical change by state by a suitable energetic influence. The memory medium 10 is as shown in FIG. 7a provided between a matrix of substantially orthogonal intersecting electrodes 11 and 12 such that these in relation to the memory medium forms a substantially orthogonal electrode matrix which everywhere contacts the memory medium directly. It is to be understood that electrodes 11, 12 may be realized as the above-mentioned conducting structures in a memory layer M. In the intersection between an underlying electrode 11 and an overlying electrode 12 it is in the memory material 10 formed a logic cell which under influence of voltage, current or an electric field may attain a state which can represent the predetermined logic value of the cell. These logic cells hence constitute the memory elements in the memory as shown in FIG. 7a. Each of the electrodes 11, 12 is connected with a memory bus module 2' via addressing lines 13 and the memory bus module is over the memory bus 2 connected with a memory interface 1 which may be provided in another layer in the data processing device and spaced apart from the memory layer in question, the memory bus 2 for this purpose partly being embodied as vertical conducting structures which extend through the different layers in the data processing device, as this schematically is indicated in FIG. 7b which shows a section through the memory in FIG. 7a taken along one of the electrodes 12. FIGS. 7c and 7d shows sections through the separate memory cell 14 which is formed in the intersection between an overlying electrode 11 and an underlying electrode 12. It is to be understood that the electrodes 12 and 11 may be provided in or on the memory medium 10 and contact this directly or it may on both sides of said memory medium be provided not shown dielectric layers, such that the electrodes 11, 12 contact the memory medium 10 indirectly. If a voltage is applied to the electrodes 11, 12 is in each case a direct or indirect electrical connection obtained through the memory element, such that it may be brought to definite state or that a definite state in the memory element 14 may be detected. The change of state in the memory element 14 may be a change in the current or voltage characteristics of the memory material in this location or a change in the impedance value of the material. By selecting suitable materials a condition of state in absence of voltage or electrical fields will be permanent such that the state is maintained permanently and the memory in FIG. 7a hence realizes a non-volatile electrically addressable memory device. The memory material in itself may be a polymer, material, for instance a conjugated polymer and it may also comprise an anistropic electrical conducting material, that is a material which only conducts electricity in the transversal direction between the electrodes, such that in the memory material are not generated electric currents which propagate in the longitudinal direction. The memory material 10 may also be realized in this way or added substances which causes it under influence of voltage or electric fields to transfer from a crystalline into an amorphous phase or vice versa, the current/voltage characteristics of the phase state being distinct and allowing a detection. The electrodes 11, 12 which are realized in the form of horizontal conducting structures in the memory layer M in question may in themselves be a conducting organic material and be realized in form of the deposited metal-organic compounds or as metals on the surface 10 of the memory material. Further the memory element or the logic cell 10, 14 may realize a rectifying diode between the electrodes 11, 12 such that the memory device in FIG. 7a forms an electric network of such diodes. The consequence of this shall be described more closely in the following, but a diode network of this kind may prevent write and/or detection errors due to sneak currents from a memory element to another in the electrode matrix. Particularly, there may be used an organic memory material 10 which spontaneously forms a diode junction in the memory element 14. Further it is regarded as advantageous that the logic cell is realized such that the memory material 10 under influence of electric currents or electric fields undergoes a reaction which causes the resistant value of the separate logic cell to change. Then the value of the logic cell may be detected by measuring the impedance of a logic cell, and this detection of course corresponds to a reading of the content of the memory device as shown in FIG. 7a. If the logical value of the memory element can be switched reversibly, the memory device in FIG. 7a realizes a write/read memory or memory of the ERASABLE type, but there is nothing against that the logic value may be switched irreversibly, such that the memory device in FIG. 7a thus realizes a read only memory (ROM) or a memory of the type WORM. By using a memory device as shown in FIG. 7a in a stacked memory layers M, these must be mutually isolated and this can take place by providing dielectric thin layers 15 on each side of the electrodes. If the electrodes now 11, 12 now are located on the surface of the memory material, they may simultaneously be incorporated in these dielectric layers 15 as shown in FIG. 7d.

In a variant of the memory device in FIG. 7a, where the memory device in itself still has the same electric configuration, the memory material 10 used, may be a thin film of ferroelectric material, as a ferroelectric material of this kind under an applied electric field may attain a first or second polarization state and be switched from a disordered state to one of the polarization states and from the first to the second polarisation state or vice versa. A logic cell or a memory element 14 may then be realized in the thin film of ferroelectric material between the electrodes 11, 12. A definite polarization state assigned to the logic element 14 represents the logical value of the logic element or the data value stored in the memory element. In each case the logic cell or memory element is configured as shown in FIG. 7c and FIG. 7d. If the logic material or the memory medium is a ferroelectric thin film, the logic cell or the memory element 14, however, also may be realized as shown in FIG. 7e in plan view in FIG. 7f in a section taken along the line A-A' in FIG. 7c. Here the overlying electrode 12 is spaced apart from the underlying intersecting electrode 11 by an isolating step 15'. The active area in the ferroelectric thin film will then appear as thin stripes on both sides of the electrode 12 as shown in FIG. 7e and extend towards the underlying electrode 12 such this is shown in FIG. 7f and where the field lines furthermore is indicated by arrows. In the fabrication of a memory device based on a ferroelectric thin film as mentioned herein, first electrodes 11 are formed by patterning of a suitable material, for instance provided on a not shown isolating substrate. A continuous layer 15 of an isolating material is provided above this and on the top thereof the overlying electrodes 12 such that a substantially orthogonal electrode matrix is obtained. After the deposition of the electrodes 12 the isolating material 15 is etched or removed in another manner in the portions between the electrodes, and the ferroelectric thin film 10 provided as a continuous layer above the electrodes, such this is indicated in FIG. 7f. The ferroelectric thin film 10 may be formed in a ceramic material or be a ferroelectric liquid crystal material, but will preferably be formed by a polymer or copolymer, for instance a vinylidene fluoride/trifluoroethylene copolymer.

A memory device as shown in FIG. 7a may be included in the storage unit in the data processing device according to the invention and in that case be provided as shown in FIG. 7g with stacked memory layers $M_{k-1}$, $M_k$ . . . in as large numbers as may be appropriate. The electrodes 11, 12 in the separate layers and addressing lines 13 are once again provided as horizontal conducting structures and connected to a memory bus module 2' with memory buses 2. These memory buses 2 may either be horizontal conducting structures or vertical conducting structures and provide connection between the memory layers M and an underlying memory interface 3 with and I/O-interface 9 such this is shown in FIG. 7g. A particularly advantageous variant of a memory device implemented as shown in FIG. 7g is obtained with the embodiment shown in FIG. 7h which renders a section along and through intersecting parallel electrodes 11; 12. On the isolating substrate in a first memory layer $M_{k-1}$ it is as before provided an underlying electrode 11 and a thereabove overlying electrode 12. This overlying electrode 12 in the first layer $M_{k-1}$ now constitutes the underlying electrode 11 in the succeeding memory layer $M_k$ and correspondingly the overlying electrode 12 in the memory layer $M_k$ constitutes the underlying electrode 11 in the overlying layer $M_{k+1}$. Thus, the memory device as shown in FIG. 7g and embodied with a memory layer M may come out with n+1 electrode sets 11; 12 instead of 2n electrode sets as shown in the embodiment in FIG. 7g. A configuration of this kind of the electrodes in a stacked logic device or a memory unit realized in a stacked configuration is disclosed in NO patent application 980871 which hereby is incorporated as reference and has been assigned to the applicant.

It shall now be described a further technical solution for realizing a logic device or memory device for use in the data processing device according to the present invention. This is achieved with an electrode means which is discussed in more detail in NO patent application 973390 which hereby is incorporated as reference and has been assigned to the applicant. FIG. 8a shows the embodiment of this electrode means with a functional element 17 which may have a detecting, information storing and/or information indicating function. For the purpose of the present invention it is desired that the functional element 17 shall function as a logic cell with either a switching function which may be used for realizing logic components or with an information storing function which may be used for realizing memory elements in a memory device. Particularly the functional element 17 may be electrically sensitive and then such that the electrode means will allow passive electrical addressing of the functional element. In the means in FIG. 8a an underlying electrode 11 is for instance provided on a not shown substrate and above this electrode it is provided an overlying electrode 12 which intersects the underlying electrode 11 in a bridge configuration, as there between the electrodes 11, 12 is provided a layer 15 of electrical isolating material which also extends under the whole electrode 12 and therebetween and the not shown underlying substrate. Over both electrodes 11, 12 is provided a contact layer 16 of an electrical conducting or semiconducting material which contacts both electrodes 11, 12 electrically. Along two opposite side edges of the electrode 12 and down to the first electrode 11 the contact layer forms active areas at the intersection for electrodes 11, 12. Particularly the material in the contact layer 16 shall be an anistropic conductor or semiconductor, and it is even more desirable to apply an anisotropic conductor which is wholly realized in polymer materials. The reason for this shall be mentioned below. Over the contact layer 16 a functional element 17 is provided adjacent to or in the intersection of the electrodes 11, 12. In principle the functional element 17 might be provided in and formed as a part of intersection of the contact layer 16 above the intersection of the electrodes 11, 12 and will then substantially be conformal therewith, such that functional element 17 substantially corresponds to the active areas which are formed in the contact layer.

As shown in FIG. 8a, the functional element 17 realized as a separate element and provided at intersection of the electrodes 11,12, but above and on the top of the contact layer 16. The first electrode 11 can advantageously be made in aluminium which has a low work function, while the other electrode 12 may be made in gold which has a higher work function than aluminium. The fundamental structure of a functional element 17 and a contact layer 16 is shown in FIG. 9. Metal 1 constitutes the first and underlying electrode 11 in the means and may be made of aluminium. It forms with polymer 1 a rectifying Schottky junction, where Metal 1 in the electrode 11 constitutes a cathode. Polymer 1 is made of a first polymer material which preferably is a polythiophene. Metal 2 in the electrode 12 constitutes the anode of the structure and forms a non-rectifying junction in the polymer 1. Polymer 2 which is another polymer material constitutes the function element 17 and may be realized such that it changes its current/voltage characteristics on the application of an electric voltage or an electric field. The second polymer material is used in the functional element 17 is preferably a water-soluble polythiophene (POWT).

The structure in FIG. 9 allows a direct detection of the conductivity state of the functional element 17 on the basis of the current/voltage characteristics of the means. The electrode means as shown in FIG. 8 may be used in an electrical addressable logic device, particularly a passive addressable memory device, such this is shown schematically realized in FIG. 10. A plurality of electrodes 11, 12 are provided such that they form a substantially orthogonal matrix of x.y-electrodes and with the electrode means in FIG. 8 in each intersection of the electrodes. When the electrode means are realized with the structures as shown in FIG. 9, it is at each intersection between an x electrode and an y electrode obtained a diode 13 which in each case has the same condition direction. It is also possible that the separate electrode means may be realized with an inherent rectifying function. This rectifying function is necessary to avoid cross-talk problems in addressing the electrode means used in a passive matrix as shown in FIG. 10. A selective addressing of the separate electrode means namely requires that in each electrode means there must be a rectifying contact, for instance as mentioned between the underlying electrode 11 and a contact layer 16. With a functional element 17 in x,y-position in the matrix shall be addressed, there must be no current transfer at adjacent intersections (x+1,y), (x−1,y), (x,y−1). It shall in that connection be understood that diodes 18 in FIG. 10 only constitutes an equivalent model of the rectifying function of the electrode means in the intersection between the electrodes 11, 12.

When an electric voltage is applied to the functional element at intersection between x,y-electrodes 11, 12 in the electrode matrix in FIG. 10 or it is subjected to an electric field, the functional element undergoes changes, for instance in resistivity, capacitance or current/voltage characteristics. Then a passive electrical addressable memory may be realized, with writing to each separate memory element, the memory element of course corresponding to the electrode means with the functional element 17 as shown in FIG. 8. It will also be possible using the contact layers 16 itself as a memory material, and writing to a memory location or bit spot, that is to the separate memory cell may then take place by changing the electrical properties of the contact layer in the active area in the electrode means. For instance writing may take place by destroying the conductivity such that there are no longer obtained an electrical contact between the electrodes 11, 12 in the memory element. This may be used for realizing a read only memory (ROM) or a memory of the type WORM. The memory 10 may also be realized such that the conductivity in the contact layer is gradually reduced. If this reduction takes place in predetermined steps, each memory element may store several bits and the memory device in FIG. 10 will then be able to realize storage in each memory cell according to a given multilevel code. This can increase the storage density in an essential degree. In that connection reference shall also be made to the above-mentioned NO patent application 972803.

Electrode means as shown in FIG. 8 may also generally be used as a logic device in the data processing device according to the invention. This presupposes that the functional element 17 in each electrode means is adapted such that it can be switched from a state to another, possibly between several states and hence be used for realizing logic gates or logic networks. The same condition will of course be present if the device shown in FIG. 10 shall be used for realizing a RAM or a memory of the type ERASABLE. Purely practically can the device disclosed in NO patent application 973390 be used for realizing a memory device with an order of magnitude of 1 $cm^2$ and wholly in a thin-film technology. The separate memory elements may then be made as small as practically possible to attain with patterning methods for electrodes, contact layers and functional elements. In principle there would be nothing against that the material in the contact layer was an isotropic conducting material, but this is based on the condition that the contact layer is thin and that at the distance between the electrode means, that is the intersection between the electrodes 11, 12 in the matrix in FIG. 10, is large. If it is desirable with the high storage density in a memory device realized as shown in FIG. 10, the extension of the electrode means as shown in FIG. 8 will be small and the intersections 11, 12 in the electrode matrix be located very close to each other. It is then an obvious advantage using an anisotropic conducting material, particularly a polymer material, in the electrode means in FIG. 8.

Finally, it shall be mentioned that the contact layer also may be realized with non-linear current/voltage characteristics and made in a semi-conducting organic material, for instance a semi-conducting polymer. With the structure shown in FIG. 9 as a starting point it will then be possible to realize the electrode means in FIG. 8 with a transistor function. This shall not be discussed in further detail here, but will be mentioned in the following in connection with the discussion of transistors which may be used for realizing active components in the processing unit and the storage unit in the data processing device according to the present invention. In the above there is in connection with the discussion of FIGS. 7–10 substantially presupposed that the means shown therein shall be used for realizing information storing functions, that is realized as memories in the storage unit. It is, as already mentioned, nothing against that they may be used for realizing logic devices generally, if the logic material or the active material used between the electrodes can be switched reversibly. A further discussion of a fabrication of the means shown in FIGS. 7–10 is omitted here, as it will in part be well-known to persons skilled in the art and in part is disclosed in the above-mentioned Norwegian patent application and the references cited therein and whereto reference in that connection can generally be made.

Now shall transistors be discussed, particularly field-effect transistors (FET) which may be used as active components in the processing unit and/or in the storage unit in the data processing device according to the present invention and generally be used for realizing processors and interfaces as used in the data processing device according to the invention. If a first processor layer is provided adjacent to a silicon substrate, it will of course be nothing against that the processor layer can be realized with devices in the form of integrated circuits and then as monolithic integrated circuits, but possibly also as hybrid integrated circuits. Field-effect transistors based on amorphous inorganic semiconductors and realized in thin-film technology may for instance be integrated in conventional monolithic solutions in a substantially silicon-based technology. An example of the embodiment of thin-film transistors with the active semiconductor material in the form of amorphous Si:H in a 10 nm thick layer (D. B. Thomasson & al., IEEE El. Dev. Lett., p. 117, vol. 18. March 1997) is shown in FIG. 11. A gate electrode 21 which may be a metal is provided in a substrate 20. Above this gate electrode an isolating layer 24 in the form of silicon nitride (SiN) is provided and thereabove is the active semiconducting material in the form of amorphous Si:H provided in a 10 nm thick layer. The drain respectively the source electrode 22 are provided mutually separated on the active semiconductor material 23. They are made in another metal than that which was used in the gate electrode 23. The use of a processor layer P provided directly on the substrate S or adjacent to a processor interface 3 provided on the substrate S makes it as mentioned possible to realize both layers wholly in a conventional semiconductor technology, either in the form of monolittic or hybrid integrated circuits and if the additional, overlying processor memory layers wholey is realised in a technology based on substantially organic materials, a hybrid solution for the data processing device according to the invention is obtained.

It is also nothing against that all layers, that is processor layers, memory layers and interface layers wholly are realized in organic thin-film technology. In that connection it shall be convenient to use an organic thin-film transistor as shown in FIG. 12 (A. Dodabalaput & al., Appl. Phys. Lett. pp. 4227–29, vol. 69, December 1996). Here an active semiconductor material in the form of an amorphous organic compound, for instance a polymer or aromatic molecules is used. The gate electrode 21 is provided on a substrate 20 and above the gate electrode is provided an isolator 24 which as well will be made by applying a oxide coating to the surface of the gate electrode, for instance realized by oxidizing the material in the gate electrode surface. The drain and source electrodes 22 are provided over the isolator layer 24 and mutual spaced apart, and above the drain or source electrode is provided a layer 23 of active organic semiconductor material which also covers the exposed portion of the gate isolator 24. The organic semiconductor material may be a conjugated polymer or aromatic molecules.

Field-effect transistors realized in thin-film technologies as shown in FIGS. 11 and 12 have very small dimensions in the vertical direction and may hence be used in the very thin layers which the processor unit and the memory unit in the data processing device according to the invention presupposedly are generated from. The field-effect transistors shown in FIGS. 11 and 12 are, however, realized in horizontal geometry and will hence occupy a relatively large horizontal surface in the layer. Larger devices in the layers may be obtained if active components in the form of field-effect transistors with a vertical geometry are used, realized in thin-film technology and based on organic materials.

A field-effect transistor of this kind is disclosed in Norwegian patent application 980224 which hereby are incorporated by reference and which has been assigned to the applicant. On a substrate 20 is provided a film 22 of conducting material which constitutes a first electrode in the transistor. Over this film there is provided an isolating material which constitutes a first isolator 25 and thereabove is provided a further conducting material which constitutes a second electrode 21 in the transistor. On this second electrode 21 is provided an isolating material 25 which constitutes a second isolator in the transistor and above the second isolator is provided a film 22' of conducting material which constitutes a third electrode of the transistor. Realized as a field-effect transistor the first and third electrode 22, 22' constitutes a drain electrode and source electrode respectively of the transistor or vice versa. The second electrode 21 constitutes the gate electrode. Both the second and the third electrode 21; 22' and the isolators 25 are provided on the first electrode 22, such that they over this and the substrate 20 forms a vertical step, the extension of which is indicated with the reference number 26 in FIG. 13. Thus, the structure comprised by the second or third electrode 21 and 22' and the isolators 25 only covers a part of the substrate 20 and the horizontal extension of the layers which form the vertical step 26 on the first electrode 22 or the substrate may realized in thin-film technology be made very small, for instance some ten nanometers. Above the exposed surface of the gate electrode 25 which is included in the vertical step 26 is provided an isolating material 24 which constitutes the gate isolator of the field-effect transistor. Over the top of the third electrode 22' which for instance may be the source electrode of the transistor, over the vertical step 6 and down to the first electrode 22 which may be the drain electrode of the transistor, is provided a layer 23 of active semiconducting material which may be an amorphous, polycrystalline or microcrystalline, inorganic or organic semiconducting material.

The gate electrode 25 is isolated against the active semiconducting material 23 by the gate isolator 24, such that charge injection is prevented. A substantially vertical transistor channel 23' is defined in the active semiconducting material 23 and extends between the source and drain electrodes 22, 22' and substantially adjacent to the vertical step 26 as shown. It is optional whether the first electrode 22 and the third electrode 22' respectively shall be the drain electrode or source electrode. The transistor effect will either be given by a depletion mode or an enrichment mode, depending on the gate potential. In regard of the fabrication of this field-effect transistor in thin-film technology, reference shall be made to the patent application cited. The field-effect transistor as realized in thin-film technology will in the vertical direction have a dimension which wholly is compatible with thickness of the processor layer or the memory layer realized in thin-film technology for use in the data processing device according to the invention, but shall have a far smaller horizontal extension than for instance the thin-film transistor shown in FIG. 12 and hence furnish a higher device density in a layer in question. A further field-effect transistor with the MIS structure realized thin-film technology is disclosed in U.S. Pat. No. 5,347,144 (Garnier et al.) which hereby is incorporated by reference, and which has been assigned to the applicant. The MISFET shown therein realized in thin-film technology may be used as a switching or amplifying device in the data storage device according to the present invention. This transistor has a thin semiconducting layer between a source electrode and a drain electrode. The semiconductor layer contacts a surface of a thin film of isolating material which by its other surface contacts a conducting gate electrode. The semiconducting material itself comprises at least one conjugated organic compound with a predetermined molecular weight. The thin film of isolating material is made in an isolating organic polymer which can have a dielectric constant of at least 5.

In connection with the discussion of the device in FIGS. 11, 12 and 13 it is to be understood that the separate, specifically mentioned layers in reality will be a sublayer when the device shown is included in a processor layer P or a memory layer M in the data processing device according to the invention.

In addition it has recently also been proposed and described other active semi-conducting components where the semiconductors are based on organic polymers or oligomers. It will thus generally not be difficult to realize the data processing device according to the present invention wholly with the devices formed of a substantially organic material, be that in the processing unit or storage unit.

For the present invention it may be particularly attractive using organic materials the electrical properties of which may be modified under the influence of electromagnetic radiation, particle radiation or electric fields. Particularly it is attractive for the present invention to generate the separate main layers of one or more sublayers or such materials which is processed, either before or after the joining into one or more main layers, with the application of electromagnetic radiation with given intensities or frequency characteristics, such that the separate sublayers which are included in a main layer P, M, MP thus obtain the desired electrical properties in selected portions, for instance by the applied radiation being spatially modulated through a mask or a spatial light modulator. A process of this kind will in principle hence resemble the use of photolithographic processing in common semiconductor technology.

In the present invention the separate main layer, be it a processor layer P or a memory layer M, may be built up by sublayers which shall be provided with different properties before they are joined into a main layer. In a memory may for instance the memory material be provided in a central sublayer are surrounded by separate electrode layers, and there may between the separate sublayers be provided separate isolating layers, such this for instance is evident from FIG. 7g. Correspondingly can for instance an active device such as transistor in FIG. 12 be built up by depositing sublayers 20, 21, 22, 23 with determined properties. It is, however, thinkable that the transistor structure similar to the one in FIG. 12 can be realized in one and the same organic material, as the separate sublayers are processed separately before joining by irradiation with for instance light, such that each of sublayer patterned and unpatterned obtains the desired electrical property which shall enter into the realization of a field-effect transistor in thin-film technology. This is to say that a first sublayer could be an isolator, a second sublayer a conductor, a third sublayer a semiconductor, a fourth sublayer an isolator and finally a fifth sublayer once again an electrical conductor. For use in the present invention, whether it concerns the memory unit or the processor unit it is also desired to employ active devices, for instance the transistors mentioned, wholly realized in organic material, e.g. polymers. Similarly it is of interest to among other to generate integrated circuits wholly realized in the form of thin-film polymers. As mentioned above, among others Garnier & al. has developed and patented a MIS field-effect transistor which substantially is wholly realized in polymer technology. Generally it is of interest to be able to realize organic field-effect transistors in thin-film technology which simultaneously allows integration of the devices.

An example of a MISFET wholly realized in polymer with the use of polymer materials which are provided with the desired electrical properties by an exposure to UV radiation is disclosed in the paper "Polymeric Integrated Circuits and Light Emitting Diodes" by D. M. de Leeuw & al., IEDM, pp. 331–336 (1997).

In order to fabricate integrated circuits wholly in polymer photochemical patterning of doped electrical conducting polyaniline films (PANI thin films) is used. These are dissolved in a suitable solvent, and a photoinitiator added to the solution, whereafter the solution is deposited on a suitable substrate such as a polyamide film. By thereafter exposing the PANI film to deep UV radiation through a mask, the initially conducting polyaniline in the exposed areas is converted to the non-conducting leuoemeraldine form. The starting point here accordingly is a conducting polymer material, the area resistance of which initially is 1 kgohm/square, but which after the exposure obtains an area resistance of more than $10^{13}$ ohm/square.

In this manner dielectric structures may be generated in an otherwise conducting matrix. In addition thin films of this kind need not to be planarized after the exposure.

FIG. 14 shows a MISFET according to D. M. de Leeuw & al. Here doped polyaniline PANI is deposited as a thin film 22 on a polyimide substrate 20. After exposure to UV light through suitable mask isolating structures 25 is formed in the otherwise conducting PANI film 23. The still conducting areas 22 in the PANI film define respectively source and drain electrode in a MISFET transistor. The PANI film 25 need not be thicker than 200 nm and comparable with the thickness of the polyimide substrate 20. Above the PANI film 22 a further layer 23 is deposited in the form of polythienylene vinylene or PTV which is an organic semi-conducting material. The PTV layer 23 is typically 50 nm thick and may be deposited by known film deposition technologies. The semiconducting PTV film determines substantially the electrical parameters of the MISFET transistor as shown in FIG. 14. Over the PTV layer is now deposited a 250 nm thick layer 24 of polyvinyl phenol (PVP), for instance by spin deposition. This PVP layer 24 forms the gate isolator of the field-effect transistor and is opaque to UV radiation and visible light. Another PANI film 21 is deposited on the top of the PVP layer 24 and once again patterned by irradiation with ultraviolet light, such that isolating structure 25 as shown in FIG. 14, are formed. The area 21 is still electrical conducting and forms the gate electrode of the MISFET structure.

If several such transistors shall be combined in integrated circuits, vertical current connections between for instance the source and drain electrodes in a transistor and the gate electrode in another transistor must be used. Vertical current paths of this kind could be realized mechanically, but far more attractive is the use of a method that proposed in NO patent application 980385 which hereby is incorporated by reference and which has been assigned to the applicant. In this patent application is given a method for generating electrical conducting and semiconducting structures shown in situ in an initially non-conducting or dielectric material which offers a number of advantages in regard of manufacturing technology. Such structures may be used for realizing horizontal and vertical current paths in thin films, for instance for implementing various thin-film technologies and further for realizing active and passive devices by using the same technology.

For quite a long time it has been known in the art that certain organic macromolecules, polymers or even biological materials have the property that they may control or modify electrical and/or optical signals. Such materials are generally known as molecular electronic materials. An example of a material of this kind is disclosed in the paper "A new material for optical, electrical and electronic thin film memories" by Z. Y. Hua and G. R. Chen, Vacuum, Vol. 43, no. 11, pp. 1019–1023 (1992). This material is an organo-metallic charge transfer complex M(TCNQ) formed by TCNQ (7,7,8,8-tetracyanoquinodimethane, $C_{12}H_4N_4$) which functions as an electron acceptor molecule with different metals as electronic donors. This material may under influence of electrical fields or light radiation and for the sake of that also energy supplied in the form of heat or electric fields transfer from a high impedance state to a low impedance state. The reaction is reversible, such that M(TCNQ) may be used for realizing a bistable switching medium, for instance an erasable memory material. By selecting the electron donor M among different metals, such as Li, Na, K, Ag, Cu or Fe, modifications of M(TCNQ) which are sensitive to certain wavelengths of light are obtained. In thin layers, for instance of 100–200 nm, M(TCNQ) has non-linear current-voltage characteristics, something which may be used for realizing ROMs and RAMs. For this purpose it is of particular interest than M(TCNQ) stably and reproducible allows current-controlled bistable electrical switching. In an electrically addressable memory may for instance the high impedance state be used for representing binary 1 and the low impedance state binary 0. The transition time between two states is less than 400 ns. The material may hence be used for realizing electrically addressable memories of the kind that is disclosed and described in connection with for instance FIGS. 7a–7d.

For the purpose of the present invention it is, however, particularly desirable to apply materials which makes it possible to realize the sublayers in the data processing device according to the invention with a well-defined mode and degree of electrical conduction in the production process and before the joining of the sublayers according to the intended function of processor layers P or memory layers M or combinations MP thereof. Such materials shall in the following in generally be denoted as convertible materials CM, as the conversion of the electronic properties of the materials may take place reversibly or irreversibly under the influence of radiation, including both photon radiation and particle radiation, heat or electrical fields. By a spatial modulation of the radiation or the electrical fields the material may be patterned, as the desired conversion of the electronic properties will be dependent on the energy supplied or the field strength applied. This is described in more detail in the above-mentioned Norwegian patent application 980385. In contrast to the above-mentioned PANI film it will be preferred that the materials initially are in a dielectric or electric non-conducting state. Where the material CM is not influenced by the electric fields or light, it will of course retain its dielectric properties and form an isolator, while it in influenced areas depending of the degree of conversion may appear with electrical semiconducting or conducting properties. Areas in the conducting film may hence in the fabrication process stably be provided with a determined degree and mode of electrical conductivity, such that they for the purpose appear as electrical conducting and may be used for forming electrodes and current paths in the separate sublayer, or as semiconducting and forming the active material of diodes and transistors. Used as a memory material the conversion further shall be reversible, such that the material CM forms a bistable electrical switch and makes possible electrically addressable and erasable memories of the above-mentioned kind, cf. the discussion in connection with a memory shown in FIG. 7a–7h. The material CM will typically be an organic material, for instance molecules, oligomers and polymers which transfers from an initial first state to a second state under influence of light in a determined frequence range. It is of course to be understood that transition between first state and the second state shall be characterized by a change in degree and mode of the electrical conductivity.

As examples of materials which may transfer from isolating to conducting states by an irradiation with light, different conjugated polymers may be mentioned, where it is simultaneously used exposure to a suitable dopant in the form of gas or liquid or polyphenylene vinylene (PPV) precursors impregnated with dyes with a strong frequency-selective absorption of light which causes them to be converted into a conjugated polymer by the irradiation. Further may a 2.5-dimetoxyphenylene derivative of PPV(DMEO-PVV) transfer from isolating to semiconducting state by an elimination reaction of polyelectrolyte films formed thereof. It will then be formed a fully conjugated chain by radiation with laster. —to Persons skilled in the art a large number of such organic or polymer-based materials is well-known and mentioned in the literature, and there shall again be referred to the above-mentioned Norwegian patent application and the references cited therein, among other with a description of organic-based thin-film transistors.—Semiconducting PPV may be formed by a sulphonium salt precursor by ion irradiation at 1000 kV $Ne^+$.

FIG. 15 shows a forward-biased pn junction diode with conducting and semiconducting structures generated by the method according to the invention and realized in thin-film technology with four sublayers SS1–SS6. The layers SS3 and SS4 contain the active semiconducting material provided between the electrodes 29 in respectively the sublayers SS2 and SS5. The active material 23' in the sublayer SS3 is an n-doped semiconductor, while the adjacent active material 23 in the sublayer SS4 is a p-doped semiconductor. The electrodes 29 in the layers SS2 and SS5 are contacted by horizontal electrical conducting structures or conducting paths 27 in layers SS1 and SS6. The separate layer in the diode structure in FIG. 15 has typically a thickness of about 100 nm such that the whole structure forms a multilayer structure with a thickness less than 1 $\mu$m. The horizontal extension of the area of the diode structure will be determined by the method for generating conducting and semiconductor structures, but by using for instance visible or ultraviolet light, an extension of less than 1 $\mu$m may be obtained.

FIG. 16 shows schematically a MOSFET for use in the present invention and realized wholly with organic material in thin-film technology. The gate electrode 21 is provided in the sublayer SS1 and connected with a horizontal conducting structure 27, while the sublayer SS2 constitutes the gate isolator 24. The active semiconducting material 23 is provided in the sublayer SS3 and registers with the gate electrode 21. The source and drain electrodes 22 are provided in the following sublayer SS4. Horizontal electrical conducting structures in the top layer SS5 contact source and drain electrodes 22 respectively in the sublayer SS4. As electrodes and current paths 27 may well have the same electrical properties, could also the horizontal electrical conducting structures 27 be provided in the layer SS4 and contact the electrodes 22 therein, such that the MOSFET-structure in FIG. 16 shall comprise a total of four sublayers SS1–SS4. Each sublayer will then specifically either consist of electrical conducting structures, be dielectric or comprise a semiconducting structure. The thickness of a MOSFET of this kind may be ½ μm, while the extension in the horizontal plane such as may be realized with present technology will be from at most a few μm to less than 1 μm.

The MOSFET structure in FIG. 16 may now be used in logic gates, for instance a logic inverter in CMOS technology as shown in FIG. 17a. An inverter of this kind is formed by parallel connection of the drain and source electrode in respectively an NMOSFET and a PMOSFET. For this purpose a vertical conducting structure 28 is generated and passes through all sublayers SS1–SS11 and connects the electrodes 22'. The output signal from the inverter is conveyed on this conducting structure 28 to a horizontal conducting structure 27 at left in the figure. The gate electrodes 21 of the MOSFETs receive the input signal via the horizontal conducting structure 27 in the sublayer SS6 at right in the figure. As gate electrodes 22 of course is at the same potential, they could be common for the inverter as shown in FIG. 17b whose MOSFETs in the figure are shown realized in a back-to-back arrangement. Also the vertical electrical conducting structures in the sublayers SS1 and SS11 could as shown in FIG. 17b be moved to the sublayers SS2 and SS10. The inverter structure of FIG. 17b could then be formed with seven and not eleven sub-layers as shown in FIG. 17a. The thickness of all sublayers will then be less than 1 μm, typically realized with about a thickness of about 0.7 μm, while the horizontal extension of the inverter will have the same dimensions as stated above in connection with the discussion of the MOSFET structure in the FIG. 16.

Active components like the MOSFET structure shown in FIG. 16 may be used in the present invention for forming integrated circuits for instance a processor in the data processing device according to the invention. Such integrated circuits are formed by stacking of sublayers with structures which have the desired electrical properties and wholly are realized in an organic thin-film technology. Specifically the following example is connected with an AND gate realized in CMOS technology, for instance with the use of the transistor structure as shown in FIG. 16.

In order to facilitate the understanding of how active devices such as field-effect transistors may be combined in multilayer structures into functional devices as for instance logic gates, reference shall be made to FIG. 18 which shows the circuit diagram for an AND gate realized in complementary MOS technology (CMOS technology). The CMOS AND gate is realized with respectively NMOSFETs and PMOSFETs of the enrichment type as switches. Two inputs signals A and B are conveyed respectively to the gate electrodes on PMOS $Q_1$ and $Q_2$ and the gate electrodes on NMOS $Q_3$ and $Q_4$. If both input signals switches A and B are high, the output signal $\overline{X}$ will be low. In this case $Q_3$ and $Q_4$ will both be on and the PMOS switches $Q_1$ and $Q_2$ will both off, i.e. on current flows and the output signal $\overline{X}$ hence goes low. If, on the contrary, either the input signal A or the input signal B is low or both are low, correspondingly the PMOS transistors $Q_1$ respectively $Q_2$ will be switched on and the output signal $\overline{X}$ goes high, as either one or both of the serially connected NMOS $Q_3$, $Q_4$ are off and no current flow. The devices $Q_1$, $Q_2$, $Q_3$, $Q_4$ realize, as will be seen, a NAND gate, and in order to realize an AND gate it is necessary to connect the output of the NAND gate to a logic inverter which also is realized in CMOS technology, respectively with the use of a PMOS switch $Q_2$ and an NMOS switch $Q_6$ connected in parallel. This is a standard CMOS inverter, and if its input signal $\overline{X}$ is high, its output signal X will be the inverted of the input signal $\overline{X}$ and hence low. Conversely a low input signal $\overline{X}$ will be inverted to a high output signal X and this corresponds to the input signals A and B to the NAND gate both being high. In other words it is easily realized that circuits as shown in FIG. 18 realize an AND gate, and persons skilled in the art will understand that correspondingly logic OR and NOR gates may be realized and with any number of inputs. However, in principle, all Boolean functions can be realized with combinations of one type of gate and one or more inverters realized in CMOS technology, for instance with the use of the transistor structure as shown in FIG. 16.

Purely practically the AND gate can be implemented in thin-film technology as shown in FIGS. 19a–19d and with the use of MOSFET structures corresponding to that shown in FIG. 7. FIGS. 19a–19d show the AND gate wholly realized in thin-film technology and with the active and passive devices provided in four sublayers SS1, SS3–SS5. The first sublayer SS1 (FIG. 19a) contains the gate electrodes $g_1$–$g_6$ where the subscript points to the corresponding subscript for the MOSFETs $Q_1$–$Q_6$ in FIG. 18. The inputs A and B are conveyed to respectively the gate electrodes $g_1$, $g_3$ and $g_2$, $g_4$ and via horizontal conducting structures or current paths 27. Correspondingly the gate electrodes $g_5$, $g_6$ in the inverter are connected with a horizontal current path 27. A vertical electrical conducting structure is denoted 28, the symbol Δ indicating that it extends upwards in vertical direction from the sublayer SS1. In FIG. 19b the symbols Δ and ∇ likewise indicate that the vertical conductor structure 28 in the layer SS3 extends vertically through this layer and on both sides thereof. The vertical layer SS3 comprises areas with active semiconductor materials $b_1$–$b_6$ which are assigned to and register with the corresponding gate electrodes $g_1$–$g_6$ in the layer SS1. —It is to be remarked that a layer SS2 exclusively, apart from the vertical conductor structure 28 which also extends through this sublayer on both sides thereof, consists of dielectric material which forms a common gate isolator for the MOSFETs $Q_1$–$Q_6$ which realize the AND gate. —The layer SS2 is, of course, located between SS1 and SS3, but has been excluded from the drawing. —The layer SS4 (FIG. 19c) is provided above and adjacent to the layer S3 and comprises respectively the source electrodes $s_1$–$s_6$ and the drain electrodes $b_1$–$b_6$ for the corresponding MOSFETs $Q_1$–$Q_6$. the active semiconductor material $d_1$–$d_6$ which is located in the layer SS3 is here indicated by stitched lines. The vertical current path 28 also extends also through the layer SS4 and to both sides thereof and contacts a horizontal current path 27 in the sublayer SS5 as shown in FIG. 14d. This horizontal current path 27d corresponds to the connection between the drain electrodes $d_2$ and $d_3$ for the corresponding MOSFETs $Q_2$, $Q_3$ and is additionally also connected with the drain electrode $d_1$ and $Q_1$. Another horizontal current path 27 realizes the serial connection between the source electrode $s_1$ on $Q_3$ and the drain electrode $d_4$ on $Q_4$. The source electrodes $s_4$ and $s_6$ are grounded on further horizontal conducting structures 27, while horizontal conducting structure 27 farthest to right in the layer SS5 is supplied with a voltage $V_{dd}$ and connects the source electrodes $s_1$, $s_2$, $s_5$ on respectively $Q_1$, $Q_2$ and $Q_5$. A further horizontal current path 27 uppermost in FIG. 19d forms the parallel connection between the drain electrodes $d_5$, $d_6$ on $Q_5$, $Q_6$ and the output line, denoted with X. The inverted output signal $\overline{X}$ from the NAND gate consisting of $Q_1$, $Q_2$, $Q_3$, $Q_4$ is conveyed on the vertical current path 28. FIG. 20 shows schematically how the layers in FIG. 19 appear in stacked configuration, the layer SS2 with the gate isolator here being included. For the sake of clarity, however, the stack is shown exploded in its separate sublayers SS1–SS5, but with correct registration and the course of the vertical current path 28 through all sublayers is indicated by the stitched line. With the gate electrode layer SS1–SS5 provided on an underlying, not shown dielectric layer, the total AND structure as shown in FIG. 11 may have a thickness of 0.75 $\mu$m and an area of about 100 $\mu$m$^2$ (12·8 $\mu$m$^2$). The volume of the structure will hence be about 75 $\mu$m$^3$. With conservative spatial resolution this implies that about 10 000 logic gates of this kind may be realized on an area of 1 mm$^2$ and with a thickness well below 1 $\mu$m. Correspondingly scaled the length of the current paths 27, 28 together becomes 60 $\mu$m.

A reduction of the current path length and a significant simplification of the structure of the AND gate may be achieved by stacking the MOSFET structures vertically as shown in FIG. 21. Again the same reference numbers as in FIGS. 19 and 20 are used, and it will be seen that the vertical AND gate structure exploits the fact that the gate electrodes $g_1$ and $g_3$ of the transistors $Q_1$, $Q_3$ are on the same common potential, the gate electrodes $g_2$ and $g_4$ in $Q_2$, $Q_4$ on another common potential and the gate electrodes $g_5$ and $g_5$ in $Q_5$, $Q_6$ on a third common potential. Hence the transistors $Q_1$–$Q_6$ are implemented in a pairwise back-to-back configuration by common gate electrodes $g_1$, $g_3$; $g_2$,$g_4$; $g_5$, $g_6$ for the corresponding MOSFET structures $Q_1$,$Q_3$; $Q_2$,$Q_4$; $Q_5$, $Q_6$. Each of the pairwise connected MOSFET structures is provided on an isolating layer which in FIG. 21 is located below $Q_3$, between $Q_1$ and $Q_4$ and between $Q_2$ and $Q_5$ in each of the MOSFET structures. The gate electrodes g are also, of course, isolated from the active semiconductor material by not explicitly denoted isolating layers which comprise the respective gate isolators. The horizontal current paths in FIGS. 19 and 20 are now substantially replaced by vertical current paths which extend through the layers and provided the same connection as shown in the equivalent circuit in FIG. 18. Particularly is shown the current path 28 which also is realized vertically in the configuration in FIG. 20 and, as will be seen, as before connects the gate electrodes $g_5$,$g_6$ on $Q_5$, $Q_6$ with the connection between the drain electrodes $d_2$,$d_3$ on $Q_2$, $Q_3$ and the drain electrode $d_1$ and $Q_1$.

The vertical AND gate structure in FIG. 21a including the substrate 1 is generated by a total of 30 sublayers, of which six relatively thick isolating layers form the gate isolators and three correspondingly thick isolating layers isolate the paired combinations of MOSFET structures mutually. With the same dimensions as indicated in connection with the discussion of FIG. 20 the whole stacked layer configuration in FIG. 21a hence will have a thickness of about 3.6 $\mu$m and be provided on an area of 16 $\mu$m$^2$. Also here could the current paths of the source and drain electrodes s,d be provided in the same layer as these, such this is shown in FIG. 21b, ad the total volume of the configuration in FIG. 21b thus becomes about 50 $\mu$m$^3$, a reduction of the volume of ⅓ relative to the configuration in FIG. 20. Most important is it, however, that the current paths which in the configuration in FIG. 20 from the indicated dimensions will have a length of about 50 $\mu$m, may in the configuration in FIGS. 21a, 21b well be less than 20 $\mu$m in an optimal embodiment, which implies a reduction well above 60%. In this connection it shall particularly be taken in regard that FIGS. 21a, 21b are schematic and that the vertical current paths are mutually displaced in the horizontal plane in order to appear more clearly. They may, however, lie in the sample plane, parallel to one of the side surfaces of the structure.

Within the scope of today's thin-film technology and using technologies as mentioned above in order to create electrical conducting and semiconducting structures in thin films by irradiation of convertible organic materials, it is wholly possible to reduce the linear dimensions in the horizontal direction, such that the component density may be increased by at least one order of magnitude. This implies that the configuration in FIG. 20 may realize about 10$^5$ logic gates of the kind shown on 1 mm$^2$ and with a layer thickness well below 1 $\mu$m, while the configuration in FIGS. 21a, 21b might realize about 6–10$^5$ gates on the same area with a somewhat better form factor, such that the increase in the device density becomes about 25% relative to the device density of the configuration in FIG. 20. An improvement in the component density of this kind presupposes as mentioned nothing else than an improvement in the area density with one order of magnitude, and this is probably no upper limit, as with pitches of an order of magnitude of 0.2 $\mu$m, which seems achievable with today's technology, it will be possible to increase the area density with two orders of magnitude and hence be able to provide 10$^6$ logic gates in a 1 mm$^2$ large layer with a thickness of about 0.5 $\mu$m.

The data processing device according to the present invention will preferably be built in the form of stacked layers on a crystalline semi-conductor substrate, for instance of silicon and with a thereupon following layer realized in a compatible inorganic semi-conductor technology. This first layer may preferably be a processor layer P or constitute a processor interface or a combination of a processor layer and a processor interface, as the latter may contribute to a controlled or dynamic connectivity of multiprocessor networks realized in another, for instance organic technology, and provided in processor layers P or combined processor and memory layers MP stacked above the bottom layer which is embodied in conventional inorganic semiconductor technology. Thus is obtained a hybrid inorganic/organic embodiment, the architecture of which allows high-speed processor circuits combined with further processors and memories based on amorphous and polycrystalline materials provided in stacked layers above the inorganic semiconductor layer. The complete data processing device will thus appear as a hybrid and include conventional semiconductor technologies, for instance based on silicon, but possibly also on gallium arsenide technology, and in addition with further use of organic materials and appurtenant technology for generation of respectively processor and memory layers P, M, MP in such materials with the use of per se known methods for deposition, patterning and physical-chemical processing. An important feature of this hybrid embodiment is that for instance silicon-based circuits in the substrate may be fabricated in standard production lines for silicon technology without danger or pollution from organic materials. The layers which are made of organic materials may be applied in succeeding processing steps in dedicated production lines.

Even if according to the invention it is preferred that the connections between the layers, current supplies and current paths can be generated by photo-conversion, that is the generation of conducting horizontal and vertical structures in an initially organic dielectric organic layer material, the electrical connections could of course also be generated in more traditional ways, for instance by means of litographic or mechanical technologies, including etching, punching etc.

Purely in terms and manufacturing technology may both in a hybrid inorganic/organic embodiment or in full organic embodiment the layers formed of organic material be deposited in stacked configuration after having completed the desired operations for generating conducting and semiconducting structures. The separate layers and sublayers may for instance be generated by processing, for instance for photoconversion of thin films, in a continuous line, whereafter the layers are laminated together to form the stacked structure. The photoconversion may also take place in already stacked, non-processed layers, but this presupposes that the stack then comprises layers where the material in each layer are spectral-selective, such that it is photoconverted only by use of radiation in a wavelength range specific for the separate layer and varying from layer to layer. The photoconversion must then start with the lowest layer in the stack. However, a method of this kind will limit the number of layers which may be stacked.

If the processing of the layers take place separately in continuous lines, where each layer or sublayer on the various steps in the line goes through different processing procedures, sublayers may be joined to main layers and main layers into the stacked structure in as large number as will be practically possible. The use of organic materials in the layers and photoconversion processes allow a far simpler and cheaper fabrication than which is the case with today's inorganic semiconductor technology. Using reel-to-reel processing allows the production to take place in large volumes and high speed and without essential dimensional restrictions. In the joining of the separate sublayers into main layers and the main layers into a stacked configuration, the registration between the layers, however, will be critical among other in order to insure that vertical conducting structures in the separate layers register mutually and for instance electrodes and active semiconductor materials in active semiconductor devices do the same. The requirement for the registration accuracy would be given by the pitches which are realizable in the fabrication of conducting and semiconducting structures, but may also practically be solved by use of e.g. interferometric methods or with the use of mechanical or electrical nanotechnology. The production methods used for realizing the data processing device according to the invention, however, lies outside the scope of the invention, but some relevant technologies are described in the patent publications and literature references cited in the application, and shall be regarded as incorporated by reference.

The data processing device according to the invention eliminates wholly the disadvantages that all functional units which comprise active components must be able to access a substrate. This have dramatic consequences for the possibilities which open to the designer, and the data processing device according to the present invention hence will be able to implement radical new solutions for data processing with resulting advantages in regard of performance.

Thus the data processing device according to the invention is in principle unlimited scaleable on the first level on the functional hierarchy, as there in principle is no limit as to how many processors and memory layers P, M, or combinations MP thereof which may be used. On the second level of the functional hierarchy the scaleability is unlimited to the same degree, as the data processing device may be realized with an many processors as desired, while the use of layers in the stacked configuration and vertical electrical conducting structures makes possible an optimal interconnection topology for a network of processors which are to work in parallel. Correspondingly, the second level of the functional hierarchy also provides an unlimited scaleability for the different memory types which are included in the storage unit, and in principle the difference between RAMs and mass memory will only be dependent on how the addressing takes place, as it preferably to each RAM will be assigned a dedicated processor in order to optimize the accessing of data and the transfer of these to the central processing units. Once again the use of vertical current paths will provide optimally short signal paths and the latency problems which will be present when using prior art, will substantially be eliminated. Finally, the data processing device on a third level of the functional hierarchy shall allow an optimum configuration of the separate memory unit or processor by using vertical structures, whether these are used for implementing either processor or memory architectures. Particularly, both second and third level of the functional hierarchy offer a possibility for scaleable processing, either by on the second level using processors which work in parallel and are connected with optimal interconnectivity in a network which allows implementation of a common processor in three dimensions or by using scaleable architecture in the separate processor, for instance by "superpipelining" in pipeline processors or by using parallel architectures based on a replication with in principle unlimited scaling and optimum interconnectivity. Particularly the data processing device according to the invention makes it simple to use interfoliated memories, that is memory layers M interfoliated between processor layers P, or combined memory and processor layers MP with resulting reduction of latency and increased performance. This implies that the data processing device according to the invention provides unique possibilities for realizing all kinds of MIMD architectures, that is computer architectures which use MIMD processing (Multiple Instructions, Multiple Data).

A brief mention will now be given of how the data processing device according to an embodiment the invention may be used for realizing scaleable MIMD architectures and how an IRAM concept may be used for tolerating and hiding latency and downtime which may appear in a scaleable data processing device.

As mentioned above, basically scaleability is available also on the third level on the functional hierarchy which implements specific processor or memory architectures. Concerning the memory unit in the data processing device according to the invention there are no generic different between separate memory types, as they physically are based on the same principle. The configuration of memories in the memory unit on the second level of the functional hierarchy will be determining whether the respective memories are implemented as a RAM or a mass storage memory. The difference between a RAM and a mass storage memory will hence be one of scale and the addressing mode used. In principle a RAM may be made so to say unlimited large and typically there will in the data processing device according to the invention be used a RAM which separately will store from 100 Mbyte to 1 Gbyte. RAMs of that size imply that accessing and addressing of data stored in a RAM shall demand a large part of the processor capacity and with normal long access time it will already in this stage arise latency problems. By implementing each RAM in the data processing device with a dedicated processor for accessing and retrieval of data, the processors which form the central processors or CPUs in the processing unit may be released for data processing tasks only and exclusively be used for executing instruction-based operations. A scheme of this kind realizes an IRAM concept, which shall be discussed in somewhat greater detail in the following.

The architecture of processors, in the following denoted as CPU, in the processing unit lies outside the scope of the present invention, but it is to be understood that the data processing device on the third level of the functional hierarchy may realize most of the known forms of the CPUs, including CPUs based on parallel architectures. For the purpose of the present invention it may be particularly appropriate to combine data parallelism and function parallelism, e.g. by using processors which employ a vector architecture for data parallelism, while the function parallelism simultaneously is realized by means of a pipeline architecture. Schematically this is shown in FIG. 22 which at the same time also illustrates the concept of parallelism by replication. A number of pipelines PL1, PL2, . . . PL$_m$ are each made up of execution units EU1, EU2, . . . The different sets of input data D$_{in}$ is conveyed to each separate pipeline and processed according to specific instructions I1, I2, . . . in the respective execution units EU1, EU2, . . . on each step in the pipeline PL in question, which outputs a set of output data D$_{out}$. Sets of input data are loaded consecutively, such that after the execution of instruction I1 in an execution EU1 of the first stage in a pipeline PL, the data set transfers further to the next execution unit EU2 which executes according to instruction I2 etc. Simultaneously new data sets are delivered consecutively to each separate pipeline PL which in this way performs data processing operations not unlike a production process based on assembly line technology. The processor comprises a large number of pipeline PL which all works in parallel. This introduces a new concept of parallelism, namely replication. In this case parallelism is also achieved by replication of functional units, viz. pipelines PL which are present in a great number and works in parallel. It shall in this connection remarked that it will be of importance to avoid latency, for instance due to lack of parallelism between functional units, in this case pipelines, and in addition due to latency which arises by processing of instructions which are so called RAW dependent (Read After Write dependent). This form for latency is inherent and the processing speed will hence be obtained by massive parallelism in the form of replication. Finally, it is to be remarked that from a logical point of view different types of pipelines will be present, for instance for operations on integers or floating numbers or for executing memory access and storage. Dependent of the logic type of pipeline number of stages in the pipeline in question shall vary and for instance will pipelines for processing integer instructions or logic instructions typically comprise four to six stages, while a pipeline for executing floating number operations typically shall have a couple of steps more. It may also be mentioned that multifunctional pipelines are known, wherein all kinds of instruction, that be integer instructions, floating number instructions and logic instructions are processed in the same physical pipeline, which when it comprises many stages and execution units, i.e. 10–15 or more, is termed a superpipeline.

Which is of interest for the purpose of the present invention is that the stratified embodiment of the data processing device allows a realization of microprocessors with a large number of pipelines in replication implemented as vertical structures, i.e. each pipeline extends to a number of sublayers in the processor layers in question. The separate execution units EU within each pipeline PL could similarly be constructed with substantially vertical structures, for instance may they comprise logic gates realized fairly similarly to what is shown in FIG. 20.

The realization of different processor architectures which may be appropriate for use in the present invention, does as mentioned not fall within the scope of the invention, but it is to be remarked that generally on the third level of the functional hierarchy almost unlimited possibilities exist for realizing a desired processor architecture, whether it is bases on data parallel or function parallel concepts or with the use of replication and pipelines in combination.

Particularly it is an object of the present invention to be able to realize a parallel architecture on thread or process level. This implies that the data processing device according to the invention is realized as an MIMD computer, MIMD computers are the most general class of parallel computers, as they allow autonomous operations on data set by means of a set of processors without any restriction of architectural nature. Both thread parallelism and process parallelism constitute subclasses of functional parallelism as both threads and processes may be seen as a sequence of instructions. The treads are, however, generated within and belong to the process. All threads which are generated within a process share the resources of the process, particularly the address base. In other words, a process thread model has a more fine-grained distribution model than the process model itself. Generally, MIMD parallel computers are regarded as representing the data technology of the future and this view has gradually been all predominant in step with the advances within integrated circuit technology which has made it possible to make microprocessors which are relatively simple and at low cost may be connected into a multiprocessor system. In the last half of the nineties MIMD computers in the form of massively parallel systems have been made with more than one thousand processors. These systems are as a rule called sealable parallel computers. The data processing device according to the present invention is well suited for realizing scalable MIMD parallel computers of this kind, as scaling may take place both at the first level of the hierarchy, i.e. the computer may be realized with a large number of processor layers and correspondingly scaled numbers of memory layers, and on the second level of the functional hierarchy which makes possible a distribution of memories and processors with the use of a network topology which provides a optimum interconnectivity. It is then no necessary requirement that the processor themselves are realized with parallel architecture, for instance of the kind that has been mentioned above. MIMD computer architectures represent a natural generalization of a von Neumann computer which in its simplest form consists of a single processor connected with a single memory module. If a von Neumann computer is extended to comprise several processors and memory modules, there are basically two alternatives. The first alternative consists of replicating processors/memory pairs and connecting them in a coupling network as separate processing elements. None of the processing elements can access a memory module in another processing element directly. This kind of MIMD computer are called MIMD architectures with a distributed memory system or message delivering MIMD architectures and may have a structure as shown in FIG. 23, wherein PE denotes processing elements or nodes. MM memories and CPU processors, all nodes PE0, . . . PE$_n$ connected with a coupling network CN. FIG. 24 shows a more practical organization of the processing elements PE in a third generation multicomputer organization, SW denoting switching units and CP communication processors. Even through the data processing device according to the present invention is well suited for realizing an architecture of this kind, for instance by generating a plurality of nodes PE in combined MP layers and the switching units SW realized as vertical structures which extend through MP layers, the disadvantage of this architecture is that only the processing elements PE scales such that memories MM and the processors CPU do not scale independently of each other, which for a number of purposes strongly may influence the flexibility of the data processing device.

The second alternative is forming a set of processors and memories, respectively in separate processor layers P or in separate memory layers M or in combined processor and memory layers MP. Any processor CPU shall be able to access any memory module MM over a switching network SN, such this is shown in FIG. 25. The set of memory modules MM0, MM1, . . . defines the global address space which is shared by all processors CPU0, CPU1, . . . Parallel architectures of this kind are called MIMD computers with shared memory system and are usually denoted as multiprocessor systems, while it has been common to call MIMD architectures with distributed memory systems for multicomputers. As also the latter can be integrated on a data processing device according to an embodiment of the invention, the latter denomination, however, is less precise and should perhaps best be reserved for physically separated data processing devices connected in networks. Depending on topology the switching network in MIMD architectures may be classified as static or dynamic networks. In static networks the switching units are permanently connected and typically realized as direct lines or connections from point to point. Usually MIMD architectures with decentralised memory systems may be based on static networks, while dynamic networks substantially are used in multiprocessor computers, i.e. MIMD architectures with shared memory system. In MIMD architectures with distributed memory system the network essentially will be occupied with transmitting complete messages which may be of any length, and message transmitting protocols are hence of great importance in systems of this kind. In MIMD architectures with shared memory system short, but frequent memory access characterizes the common use of the network. MIMD architectures with distributed memory systems offers special problems in programming, while MIMD architectures with shared memory usually are easy programmable, as it is not necessary to partition the code or the data and neither is it necessary to physically move data when two or more processors communicate. The disadvantages of MIMD architectures with shared memory system are the synchronization and problems with scalability due to memory conflicts, a problem which increases with a number of processors. A corresponding scaling of the memory capacity, i.e. the RAM capacity has turned out to be difficult due to the latency problems and the restrictions in the RAM capacity in general.

As the data processing device according to the present invention makes possible scalability on all functional levels, it shall be very well suited for implementation of common technologies in order to surmount the scalability problem in MIMD architectures with shared memory system. Firstly, the use of a switching network which offers high transfer rate and low latency shall to a high degree contribute to the improvement of the scalability. Further it has been proposed that the common shared memory system shall be extended with special small local memories, so-called cache memories, as a procedure in many cases can only be executed by accessing local data which are located in a cache memory in a processor (CPU). Unfortunately this is not always the case, and in addition a new problem arises, the so-called cache coherency problem which further restricts the performance of cache-memory-based systems. According to the present invention this is best taken care of by more or less renouncing local memories in the separate CPU and instead establish an IRAM concept, wherein dedicated processors are connected to each IRAM and exclusively are used for accessing and retrieval of data under the control of a control and communication processor which communicates with all processors, both CPUs and accessing processors, over a common processor bus. The sufficient capacity for communication and routing is ensured in an advantageous manner once more by the layerwise construction of the data processing device according to the invention with the use of both horizontal and vertical electrical conducting structure which make possible an optimum interconnectivity. This shall be discussed in somewhat more detail in the following. The use of a control and communication processor, a common processor bus and an IRAM system connected therewith makes it in addition possible to realize a so-called virtual shared memory system or a distributed shared memory architecture. In one regard this form of architecture represents a distributed memory system, but the organization of the memory address space is still such that the local memories, i.e. all RAMs which can be accessed, form components of a global address space, such that every single central processor in the processor unit can access the separate RAM and if the necessary, over the processor bus possible local memories in any other processor. Finally, it is to be remarked that there are two basic problems which have to be solved in all scalable multiprocessor systems; viz. firstly the ability to tolerate and hide latency when loading from afar and secondly the ability to tolerate and hide dead time due to synchronization errors. By using MIMD architectures with shared memory system in the data processing device according to the invention the first problem may be handled in a simple manner by using the IRAM concept and interfoliated processor and memory layers, possibly with the use of common processor and memory layers and transfer of data controlled by a fast control and communication processor which are shared by the network. Other solutions of these problems have been proposed and used in known computers, for instance the use of multithread architectures and fast context switching mechanisms which in a successful manner both are able to solve latency problem in loading from afar and the latency problem in synchronization. This method has led to the construction of multithread computers, which, however, shall not be described further here. Another and also essential problem with scalable parallel computers is an effective handling of I/O devices and I/O processes. This problem arises above all when large data volumes shall be transferred between I/O devices and distantly located processors.

In the data processing device according to the present invention it is supposed that this partly unsolved problem shall be less essential due to the almost unlimited scaling possibility on all functional levels. The transfer of large data volumes shall essentially comprise transfer of already processed data to external memories and peripheral devices, for instance display devices.

The realization of an MIMD architecture with shared memory system implies that irrespective the number of memory modules employed and irrespective how these memory modules are connected with the processors, the address spaces of all memory modules are united into a global address space which all the time is available for all CPUs in the system. The switching network for CPUs and memories must hence be realized as a dynamic network such that a temporary connection between all CPUs or between any CPU and a RAM may be provided. Purely practically this is best achieved by using a three-dimensional multiple bus system which allows that RAMs in the RAM module of the memory can be distributed in a plurality of ways, e.g. in interfoliated memory layers M or in combined memory and processor layers MP, each RAM being realized as an IRAM and via its dedicated processor being connected with a bus. All RAM buses are then controlled by the common control and communication processor. By using cache memories it has turned out to be difficult to maintain cache memory coherency with the use of three-dimensional multiple bus systems, but the IRAM concept implies that local memories dedicated to the separate CPU can be renounced while the latency problems connected with distant loading more or less may be eliminated or hidden. As the data processing device according to the present invention makes it possible to realize three-dimensional bus and network topologies, it will be possible to realize dynamic switching networks with optimal interconnectivity. In principle a very large number of processors may now all be connected dynamically with each other. Dependent on the physical size of the data processing device, it might with a suitable scaling of the RAM capacity be implemented a processing unit with several tens of processors which may be connected dynamically with complete connectivity. This is perhaps not an imposing number compared with supercomputers of the Cray type which is implemented with several thousands processors, but then one must take in regard the physical size of the computer according to the present invention, which basically is envisaged implemented with a form factor corresponding to one of the specifications for PCMCIA cards and then the possibility of being able to operate with processing speeds of one TFLOPS or more.

It is expected that three main types of MIMD architectures in a fourth generation of computers more or less shall converge. A fourth generation computer will hence comprise concepts taken both from computers with distributed memory system, computers with shared memory system and multithread computers. More particularly it is expected that it may be possible to combine multithread processors with the use of routes, cache memories and catalogue. In the data processing device according to the present invention the physical realization of the RAMs of the memory unit with the use of an IRAM concept and interfoliated processor and memory layers, possibly combined processors and memory layers, and an extensive use of three-dimensional structures for communication and realization of components wholly can eliminate the use of cache memories and the thereby resulting cache coherency problem without latency problems arising. However, it is thinkable that the functional unit in the separate CPU may be realised with local dedicated memories, e.g. physically realized as integrated data instruction buffers in each functional unit in order to increase the processing speed.

As already mentioned, an IRAM concept may be used in the data processing device according to the present invention, preferably such that a dedicated processor is assigned to each separate RAM and connected with this RAM, and the only task of which will be accessing and retrieval therein, while the CPUs of the processing unit wholly will be free for exclusively handling the execution of logic and arithmetic operations. A fundamental realization of a combined IRAM and CPU layout is shown in FIG. 26 which exploded in separate layers shows a processor/IRAM module in the data processing device according to the invention. It is to be understood that the embodiment shown therein substantially corresponds to configurations on the first and second level of the functional hierarchy. In FIG. 26 the lowermost layer forms the substrate S and comprises the processor interface 3 which herein is shown as a combined control and communication processor 30. The control and communication processor 30 is via the processor bus 4 connected with an I/O circuit 31 which in its turn is connected with I/O interface 8 in order to realize communication with external devices and peripheral equipment. Single lines 33 also connect the control and communication processor 30 with the I/O circuit 31. A further circuit 32 is provided on the substrate S and similarly connected with the control and communication processor 30 over the processor bus 4. This further circuit 32 may according to need be implemented as a dedicated circuit, for instance in the form of a programmable codec. The symbol Δ on the control and communication circuit 30 indicates that the processor bus 4 is conveyed further as a vertical bus to the first processor layer P1 provided above the substrate S where the processor bus 4 is branching in horizontal buses which interconnects microprocessors or CPUs 5 provided in the layer $P_1$ and with the control and communication processor 30. This ensures that the microprocessors 5 which are here shown in a number of 4, but in no way need to be restricted to this number, can work in parallel. Above the first processor layer $P_1$ there is adjacently provided a second processor layer $P_2$ which is connected to the layer $P_1$ via the processor bus 4. In the processor layer $P_2$ a number of dedicated processors 34 is provided and adapted to access a number of RAMs 6 provided in a memory layer M as shown in FIG. 26. This takes place via memory/processor interfaces 7 which are provided in a separate, not more precisely denoted layer interfoliated between the processor layer $P_2$ and the memory layer M. Each IRAM processor 34 is over the respective assigned interface 7 connected with a RAM 6 in the memory layer M and serves exclusively for accessing and retrieving of data in the uniquely assigned RAM and for further transfer of the retrieved data on the processor bus 4 to the microprocessors 5 for processing therein. In this connection it is to be understood that the processor bus 4 which here is envisaged configured as a three-dimensional processor bus, may be implemented with herein not shown switches and multiplexers.

The processor layers $P_1$ and $P_2$ realize a processor module and the processor layer $P_2$ the interfoliated layer with interfaces 7 and the RAM layer M realizes a IRAM module in the data processing device according to the invention. It is, of course, to be understood that the number of IRAM processors 7 and assigned RAMs 6 as shown in the figure, necessarily need not to be restricted respectively to 8, but may comprise a large or lesser number of each. Further can each RAM 6 comprise a memory port with a width of e.g. at least 1 Kb or consist of several memory groups with their own equally wide memory ports. In principle the memory bandwidth provided by IRAM module will be the product of a number of memory ports, the port width and the port frequency. The processor bus 4 connects in the processor layer $P_2$ the IRAM processors together over horizontal buses, while the connection between the IRAM processors 34 via the interfaces 7 to RAM 6 may well be formed as vertical electrical conducting structures in the layers $P_2$, M which forms the IRAM module in the data processing device according to the invention. In the layer M is further each RAM 6 interconnected over a horizontal memory bus 37 and further via vertical memory bases 2 which leads to a not shown memory interface 1, cf. FIG. 5. The memory interface 1 provides connection to further, here not shown memories which are provided in further not shown memory layers which for instance may realize a mass memory in the storage unit in the data processing device according to the invention. This memory interface 1 has in addition its own I/O interface 9 for loading data directly to the storage units, such this is shown in the mentioned FIG. 5. Also, the processor bus 4 is connected with the memory interface 9 via a vertical bus, indicated by 36 in the figure. Further lozengy symbols 35 in each layer indicate how the processor bus 4 here forms a vertical structure, which extends vertically through the layer in question.

The embodiment in FIG. 26 shows an example of replication on the second level of the functional hierarchy, viz. a multiprocessor solution for implementing a MIMD architecture with shared memory system, as mentioned above and in principle shown in FIG. 25. Via the control and communication processor 30 all processors 5, 34 may be interconnected, such that a full connectivity is obtained. Each microprocessor CPU in the processor layer $P_1$ may freely be switched between the IRAM processors 34 for accessing and retrieval of data in RAMs 6. All RAMs 6 in the memory layer M hence constitute the global address space for each microprocessor 5 in the processor layer $P_1$. An extensive use of vertical electrical conducting structures in the vertical sections of the processor bus 4 and the interfaces 7 will additionally contribute to a reduction of the latency.

The embodiment of the data processing device shown in FIG. 26 may be adapted to a card format or subjected to other convenient form factors. The substrate S may preferably be made in silicon and the components formed in a conventional inorganic semiconductor technology which together with processor and memory layers realized wholly in organic materials, for instance polymers, implicates a hybrid inorganic/organic structural solution, but the data processing device might also wholly be realized in organic materials. By using suitable form factors a silicon substrate could be replaced by one or more silicon panels provided along respective side edges of the layerwise stacked configuration. Circuits and components realized in inorganic semiconductor technology could be provided in the side panels and be connected with the electrical conducting structures in the layers via electrical edge connections in at least one, but preferably more layers.

As shown in the above-mentioned examples of preferred embodiments the data processing device for practical application may be connected with I/O equipment and external and peripheral devices, e.g. keyboards, conventional memories such as CD-ROM, and disk memories or display units. It is, however, nothing against the data processing device according to the invention being embodied with for instance a built-in display. If the data processing device is embodied in a card format, then the display may be provided in a layer on the top of the card and opposite the substrate and realized in a all-organic technology. A display of this kind may be implemented with the technology as shown in and mentioned in connection with FIGS. 8–10. The separate pixel of the display will in this case correspond to the functional element 17 in the electrode means in FIGS. 8a–c which for this purpose is realized as a light-emitting component. In this connection it shall once again be referred to the above-cited NO patent application 973390. The data processing device according to the invention may be driven with an additional power supply and will then be provided with not shown contact means and driving means, for instance provided in connection with the substrate. It is, however, nothing against using a proprietary, separate or built-in power supply, e.g. in the form of a thin planar battery which with the use of a card format could be located in its own power supply module, e.g. on the bottom side of the substrate S.

As the data processing device according to the invention also is completely scalable on the second level of the functional hierarchy, there is in reality no limitation to the number of CPU 5 and RAM 6 which may be provided. It is, however, to be understood that there are necessarily no one-to-one correspondence between RAMs and CPU, as data may be fetched from CPU 5 to any RAM 6 in the RAM layer. Simultaneously the dedicated processor 34 for RAM accessing realizes an IRAM concept and here it will, of course, be a one-to-one correspondence between RAM 6 and accessing processors 34.

The scalable concept which forms the basis of the data processing device according to the invention may be integrated with the parameters that is given in the introduction in connection with the discussion of the proposed IRAM systems. If it is e.g. supposed that the data processing device according to the invention is realized with a form factor corresponding to the PCMCIA card, i.e. of credit card size, with a thickness which for PCMCIA type I is 3.3 mm, for type II 5 mm and for type III 10.5 mm, it will be possible to implement RAMs with Gbyte capacity and mass memories with Tbyte capacity. On the first level of the functional hierarchy there may then in a card configuration of this kind be realized from about one thousand to several thousand processor and memory layers P, M, MP and with intelligent RAMs (IRAM) in large numbers for parallel processing. In principle each separate processor or even its execution units may dynamically be assigned directly to the RAMs. The generation of so-called virtual distributed memory systems will provide each separate CPU with a virtually local address space and hence be able to combine the advantages of MIMD architectures with distributed memory system and MIMD architecture with shared memory system and provide a conflict-free global physical address space. The implication thereof is that a memory bandwidth in the range of several Tbytes/s simply may be realized. Simultaneously the combination of data and function parallel CPU architectures, for instance with the use of $10^5$ parallel floating number pipelines, provides a theoretical processing speed of about 1 TFLOPS. The memory capacity of the present invention has at any rate no limit, as the RAM capacity scales with the processor capacity and still remains an optimal interconnectivity thanks to the unrestricted possibility of combining vertical and horizontal structures in stacked layers. The data processing device according to the invention configured for instance as a PCMCIA card of type I shall with a mass memory of 1000 stacked layers, an area of 100 mm² in each layer and a storage density of $10^7$ bit/mm² be able to store $1,25 \neq 10^{12}$ byte (1.25 Tbyte) which for instance corresponds to $10^6$ common books of 250 pages each. If a data compression technology, e.g. of the kind which has been commercialized as FAST Video Transfer and developed by the company Fast Search & Transfer AS, Oslo, a subsidiary of the applicant, more than 1500 evening length movies compressed from a standard video format may for instance be stored for later decoding and display in data processing device according to the invention.

It is, however, to be remarked that the data processing device according to the invention in no way has to be realized as a PCMCIA card. On the contrary it can be given an appropriate form factor for the purpose and for instance be realized as thin flexible sheets or bands of any extension, but possibly with fewer layers, or hopefully with organic materials without using any hybrid solution.

Summing up the data processing device according to the invention, beyond all realized in a standard card format such as PCMCIA, provides the first actually personal computer with full portability and which according choice may be connected against suitable peripheral units such as display devices, keyboards and printers everywhere and with a capacity which with regard to a processor performance and access time far exceeds all known computers, including also the so-called supercomputers. As the production cost for a data processing device according to the invention in no way are prohibitive, it is on the contrary expected that the cost will lie far below even today's PCs, it will represent a paradigm shift in relation to the present conception of data technology and offer almost unlimited possibility for data processing even in an individualizing and wholly personal context.

What is claimed is:

1. A scaleable integrated data processing device, provided on a carrier substrate, comprising a processing unit having one or more processors, and a storage unit having one or more memories, wherein the data processing device comprises mutually adjacent, substantially parallel stacked layers and the processing unit and the storage unit are provided in one or more of the substantially parallel stacked layers, wherein each of the substantially parallel stacked layers comprises one or more processors and/or one or more memories, and electrical conducting structures which form internal electrical connections in the layer, wherein each substantially parallel stacked layer is formed of a plurality of sublayers, having delimited portions which form dielectric, semiconducting or electrical conducting areas in the sublayer and the sublayer, in addition to at least one dielectric portion, having one or more semiconducting and/or electrical conducting portions, wherein delimited portions with a given electrical property in each sublayer are provided in a registering relationship to one or more corresponding portions in at least one of the adjacent neighbor sublayers to form integrated circuit elements which extend vertically through one or more sublayers, wherein the electrical conducting structures are formed by the electrical conducting portions in the sublayer and respectively extend horizontally in order to create horizontal electrical conducting structures or are provided in registering connection with corresponding electrical conducting portions in one or more adjacent sublayers, such that the electrical conducting structures integrated in the sublayers form three-dimensional electrical interconnecting networks in the layers and interconnect the circuit elements therein mutually in three dimensions, and wherein additional electrical conducting structures in the data-processing device interconnect the layers mutually and/or the layers with the substrate and in order to create a connection to the exterior of the data processing device.

2. A scaleable integrated data processing device according to claim 1, wherein the sublayers in one or more of the substantially parallel stacked layers are realized in a technology which on a first level of a functional hierarchy configures functionally one or more of the layers as a combined processor and memory layer, or one or more the layers substantially as processor layers or one or more the layers substantially as memory layers.

3. A scaleable integrated data processing device according to claim 2, wherein the processing unit in a layer is configured functionally on a second level of the functional hierarchy as one or more processors or parts of one or more processors, at least one processor constituting a central processing unit or microprocessor in the data processing device, and possible further processors optionally being configured as control and/or communication processors respectively.

4. A scaleable integrated data processing device according to claim 3, wherein the central processing unit is configured functionally on a third level of the functional hierarchy as a parallel processor with several execution units working in parallel provided in one and the same layer or in two or more layers or in sublayers thereof to provide an optimal interconnection topology.

5. A scaleable integrated data processing device according to claim 3, wherein more than one central processing unit is provided, wherein each central processing unit is mutually interconnected and adapted for working in parallel and provided in one and the same layer or in two or more layers to provide an optimal interconnection topology.

6. A scaleable integrated data processing device according to claim 3, wherein the storage unit in a layer is configured functionally on the second level of the functional hierarchy as one or more memories or parts of one or more memories, at least one memory constituting a RAM and being connected with at least one control processing unit or microprocessor, and possible further memories optionally being configured as high-speed memories, ROMs, WORM, ERASABLE and REWRITEABLE respectively.

7. A scaleable integrated data processing device according to claim 6, wherein two or more RAMs are connected to a central processing unit and respectively assigned to two or more subunits in the central processing unit, RAMs and the subunits being distributed in selected combinations in one or more layers to provide an optimal interconnection topology.

8. A scaleable integrated data processing device according to claim 6, wherein two or more central processing units are provided which are connected with one or more common RAM or RAMs, and each central processing unit is provided in mutually adjacent layers, or distributed in selected combinations between two or more layers, and that the common RAM or RAMs are provided in selected combinations in one or more of the layers and/or in one or more memory layers adjacent to the latter or interfoliated there between to provide an optimal interconnection topology.

9. A scaleable integrated data processing device according to claim 6, wherein at least a part of the storage unit constitutes a mass memory, the mass memory optionally being configured as RAM, ROM, WORM, ERASABLE or REWRITEABLE or combinations thereof.

10. A scaleable integrated data processing device according to claim 2, wherein the data processing unit comprises several processor layers and several memory layers, and the memory layers, in order to reduce the signal paths there between and the processor layers, are interfoliated between the latter.

11. A scaleable integrated data processing device according to claim 1, wherein further electrical structures are provided as electrical edge connections on or over at least one side edge of one or more layers in order to contact electrical conducting structures in other layers and/or provide electrical connection between layers and substrate.

12. A scaleable integrated data processing device according to claim 1, wherein the further electrical conducting structures are provided as vertical conducting structures in one or more layers and form electrical connections in the cross-direction of the layers and perpendicular to their planes in order to contact electrical conducting structures in other layers and/or to provide electrical connection between the layers and substrate.

13. A scaleable integrated data processing device according to claim 1, wherein one or more layers are formed of an organic thin-film material, the organic thin-film material or materials selected from the group consisting of monomeric, oligomeric and polymeric organic materials and metal-organic complexes, and combinations thereof.

14. A scaleable integrated data processing device according to claim 13, wherein all layers are formed of organic thin-film material.

15. A scaleable integrated data processing device according to claim 1, wherein one or more layers are formed of inorganic thin-film material, the inorganic thin-film material or materials being selected from the group consisting of crystalline, polycrystalline and amorphous thin-film materials, and combinations thereof.

16. A scaleable integrated data processing device according to claim 1, wherein two or more layers are formed of both organic and inorganic thin-film materials or combinations thereof, the organic thin-film material or materials being selected from the group consisting of monomeric, oligomeric and polymer organic materials and metal-organic complexes, and combinations thereof, and the inorganic thin-film material or materials being selected from the group consisting of crystalline, polycrystalline and amorphous thin-film materials, and combinations thereof.

17. A data processing device, comprising:
   a carrier substrate; and
   a plurality of main layers formed above the carrier-substrate, wherein each main layer is one of a processor layer, a memory layer, or a combination layer, and wherein at least one main layer includes logic devices formed from organic materials.

18. The data processing device of claim 17, wherein the at least one main layer comprises a plurality of vertically stacked sublayers, wherein:
   at least one sublayer includes at least one horizontally conducting structure for electrically connecting logic devices; and
   at least one sublayer includes at least one vertically conducting portion for electrically connecting logic devices.

19. The data processing device of claim 18, wherein at least one vertically conducting structure is formed from aligned corresponding vertically conducting portions of at least two adjacent sublayers.

20. The data processing device of claim 18, wherein the logic devices of the at least one main layer are formed to extend vertically through at least one sublayer.

21. The data processing device of claim 18, wherein portions of an organic material layer of the at least one sublayer are configured to have varying mode and degree of electrical conductivity.

22. The data processing device of claim 21, wherein the organic material layer at least one of polymer molecules, aromatic molecules, polyaniline films, and polythienylene vinylene films.

23. The data processing device of claim 21, wherein the electrical conductivity of the organic material layer is accomplished through application of at least one of electrical fields, voltages, currents, photon radiation, and particle radiation.

24. The data processing device of claim 17, wherein a first main layer formed directly above the carrier substrate is formed from a plurality of sublayers, wherein at least one sublayer of the main layer is based on inorganic technology.

25. The data processing device of claim 24, wherein the at least one sublayer is based on silicon or on thin film technology.

26. The data processing device of claim 17, wherein a memory portion of at least one memory layer or at least one combination layer comprises:
   a plurality of substantially parallel overlying electrodes;
   a plurality of substantially parallel underlying electrodes, wherein the overlying and underlying electrodes intersect to form a matrix; and
   a plurality of logic cells formed at the intersections of the matrix.

27. The data processing device of claim 26, wherein the underlying electrode is made from a material with a lower work function relative to the overlying electrode, and wherein at least one logic cell comprises:
   a first polymer in contact with the underlying electrode;
   a second polymer in contact with the overlying electrode; and
   a third polymer formed between the first and second polymers, such that the first, second, and third polymers form a rectifying diode.

28. The data processing device of claim 27, wherein:
   the first and second polymers are formed from polythiophene; and
   the third polymer is formed from water-soluble polythiophene.

29. The data processing device of claim 26, wherein at least one logic cell is formed from ferroelectric material.

30. The data processing device of claim 26, wherein at least one logic cell is configured to store more than two levels of code.

31. The scaleable integrated data processing device of claim 1, wherein one or more of the plurality of sublayers is formed from organic materials.

* * * * *